(12) United States Patent
Krivoshlykov

(10) Patent No.: US 8,093,139 B2
(45) Date of Patent: Jan. 10, 2012

(54) METHOD FOR FABRICATION OF ALIGNED NANOWIRE STRUCTURES IN SEMICONDUCTOR MATERIALS FOR ELECTRONIC, OPTOELECTRONIC, PHOTONIC AND PLASMONIC DEVICES

(75) Inventor: Sergei Krivoshlykov, Shrewsbury, MA (US)

(73) Assignees: Anteos, Inc., Shrewsbury, MA (US); Altair Center, LLC, Shrewsbury, MA (US)

( * ) Notice: Subject to any disclaimer, the term of this patent is extended or adjusted under 35 U.S.C. 154(b) by 574 days.

(21) Appl. No.: 12/316,281

(22) Filed: Dec. 11, 2008

(65) Prior Publication Data
US 2010/0147674 A1    Jun. 17, 2010

(51) Int. Cl.
*H01L 21/20* (2006.01)
*H01L 21/36* (2006.01)
*H01L 21/28* (2006.01)

(52) U.S. Cl. ........ 438/479; 438/478; 438/602; 438/584; 257/E21.17; 257/E21.05

(58) Field of Classification Search .................. 438/479, 438/478, 602, 584; 257/E21.17, E21.05
See application file for complete search history.

(56) References Cited

U.S. PATENT DOCUMENTS 6,882,051 B2 *   4/2005   Majumdar et al. ............ 257/746
7,135,728 B2 *   11/2006  Duan et al. ..................... 257/296

* cited by examiner

*Primary Examiner* — Alexander Ghyka
*Assistant Examiner* — Seahvosh Nikmanesh

(57) ABSTRACT

The present invention describes a method of fabrication of nanocomposite semiconductor materials comprising aligned arrays of metal or semiconductor nanowires incorporated into semiconductor material for application in various electronic, optoelectronic, photonic and plasmonic devices employing self-assembling of the nanowires under light illumination from charged interstitial defect atoms, which are either inherently present in the semiconductor material or artificially introduced in the matrix semiconductor material.

20 Claims, 16 Drawing Sheets

METHOD FOR FABRICATION OF ALIGNED NANOWIRE STRUCTURES IN SEMICONDUCTOR MATERIALS FOR ELECTRONIC, OPTOELECTRONIC, PHOTONIC AND PLASMONIC DEVICES

BACKGROUND OF THE INVENTION

1. Field of the Invention

This invention relates to nanocomposite semiconductor materials and structures for applications in various electronic, optoelectronic, photonic and plasmonic devices, such as inorganic or organic semiconductor materials incorporating aligned nanowires made of metals or semiconductors. It describes a fabrication method employing new process of photo-modification for self-assembling the aligned nanowires and nanowire arrays made of metal or semiconductor materials at specific positions in the near-surface region or in bulk of the matrix semiconductor material, which are defined by light illumination. It also provides examples of some new optoelectronic and photonic components, which could benefit from application of the developed technology and nanocomposite materials. Preferred embodiments include components of diffractive optics, diffraction gratings, phase retardation plates and polarizers operating in both visible and infrared spectral regions, antireflection layers, all-optical and electro-optical spatial light modulators, nonlinear optics and optical limiters, linear and nonlinear waveguide components for optical signal processing, Bragg gratings, photonic crystals, optical recording of information, infrared detectors, light emitting diodes and diode lasers.

2. Background of the Invention

Metal or semiconductor nanowires are building blocks of many future nanodevices. Semiconductor materials are workhorse of the most current and future optoelectronic and photonic devices. Therefore methods for fabricating the nanocomposite semiconductor materials comprising aligned arrays of nanowires are fundamentally important for development of many electronic, optoelectronic, photonic and plasmonic devices.

There are many methods for fabrication of nanowires employing different growth mechanisms. The method of vapor-liquid-solid (VLS) [Wu Y, Yang P. J Am Chem Soc; 123 (2001) 3165-66] enables controlled growth of the one-dimensional nanostructures with the assistance of metal catalysts prepared from particles or thin films. After injecting precursor gases, semiconductor wires grow from the catalytic particles at an elevated temperature [Hamilton, J. M., Romano, L. T.: WO06016914A2 (2006).]. However, the metal catalysts contaminate the grown nanowires and complicate the nanowire fabrication process. An extra purification is required for removing the catalysts. Therefore, one of the major challenges in fabricating nanowires is to synthesize high purity single-crystalline nanowires without using metals catalysts in the process.

The nanowire-like semiconductor crystals can be fabricated using colloidal methods patented by Alivisatos et al. [Alivisatos, A. P., Peng, X., Manna; Liberato: US20016225198 (2001)]. By using mixtures of surfactants that bind to different crystallographic faces, the shape of growing crystals could be controlled. To control the growth directions of nanocrystals one can adjust the ratio of organic surfactants changing the surface energies of the growing crystal faces.

Nanowires can also be fabricated using electrodeposition, where metal nanowires are grown on a template containing nanometer-sized cylindrical pores in a suitable insulating membrane having one side coated with a metal layer as an electrode. Chien et al. patented an invention [Chien, C. L., Searson, P. C., Liu, K.: U.S. Pat. No. 6,187,165 (1998)] on the fabrication of bismuth nanowires by using this method. After inserting the coated membrane into a suitable deposition solution containing a bismuth-based electrode as the second electrode, bismuth nanowires can be obtained by applying a voltage. The diameter of the wires can be controlled from tens of nanometers to microns depending on the pore size.

Another patent related to the template growth of nanowires employs asymmetric lattice-mismatch between two crystalline materials [Chen, Y., Williams, S. R., Ohlberg, D. A. A.: US20036656573 (2003)]. This allows epitaxial growth of the self-assembled nanowires on a crystalline substrate. The nanowires can be aligned on the surface due to preferential growth in one direction. The self-assembled nanowires are only formed with an appropriate deposition rate and deposition temperature.

The present invention is related to the method of fabrication of aligned metal or semiconductor nanowires incorporated into a matrix semiconductor material employing new process of photo-modification of the semiconductor materials. The nanowires and nanowire arrays are self-assembled in the light illuminated regions of semiconductor from charged interstitial defect atoms, which are ether inherently present in the semiconductor material or artificially introduced in this material. The nanocomposite materials comprising the aligned arrays of nanowires incorporated in the semiconductor material find numerous applications in various electronic, optoelectronic, photonic, and plasmonic devices, some of which are described in this patent.

OBJECTS AND SUMMARY OF THE INVENTION

It is an object of the present invention to provide a method for fabrication of nanocomposite semiconductor materials incorporating the aligned nanowires or arrays of nanowires self-assembled at specific positions defined by light illumination.

Another object is to describe procedures for fabrication of such nanocomposite semiconductor materials.

Another object is to provide methods for creating sufficiently strong electric field moving the charged interstitial defects in the semiconductor material.

Another object is to provide methods for creating additional oscillating electric field in the semiconductor material supporting conversion of the charged interstitial defect atoms into neutral material, from which the aligned nanowires are self-assembled.

Still another object is to provide a method for self-assembling individual nanowires at specific positions or highly ordered arrays of the nanowires by using near field illumination through metal nanochannel templates.

Another object is to provide method for fabrication of metal ohmic contacts to semiconductor materials.

A further object is to provide method for fabrication of nanocomposite photovoltaic materials and infrared imaging detectors.

Still another object is to provide method for fabrication of polarization imaging detectors.

Another object is to provide method for fabrication of nanocomposite nonlinear optical and electro-optical materials and components for optical signal processing and recording of information.

Another object is to provide method for fabrication of diffractive optical elements on semiconductor materials, including diffraction gratings.

Still another object is to provide method for fabrication of semiconductor materials with artificial birefringence employing refractive index structures with subwavelength periodicity.

Another object is to provide method for fabrication of anti-reflection layers on optical components made of semiconductor materials.

Another object is to provide method for fabrication of linear and nonlinear integrated optical waveguide components, Bragg gratings and photonic crystals for optical processing of information and sensor applications.

An additional object is to provide method for fabrication of photonic crystal structure and Bragg gratings in active region of p-n junction of laser diodes for improving their spectral brightness, beam quality, thermal stability and overall efficiency.

Still another object is to provide method for cleaning specific regions of the semiconductor material from interstitial defects.

A further object is to provide method for fabrication of diffraction gratings on middle infrared optical fibers made of such semiconductor materials as AgBr and AgCl.

Briefly stated, the present invention describes a method for fabrication of nanocomposite semiconductor materials comprising aligned array of nanowires and applications of these materials in various electronic, optoelectronic, photonic, and plasmonic devices.

BRIEF DESCRIPTION OF DRAWINGS

The above, and other objects, features and advantages of the present invention will become apparent from the following description read in conjunction with the accompanying drawings.

Figure 1:
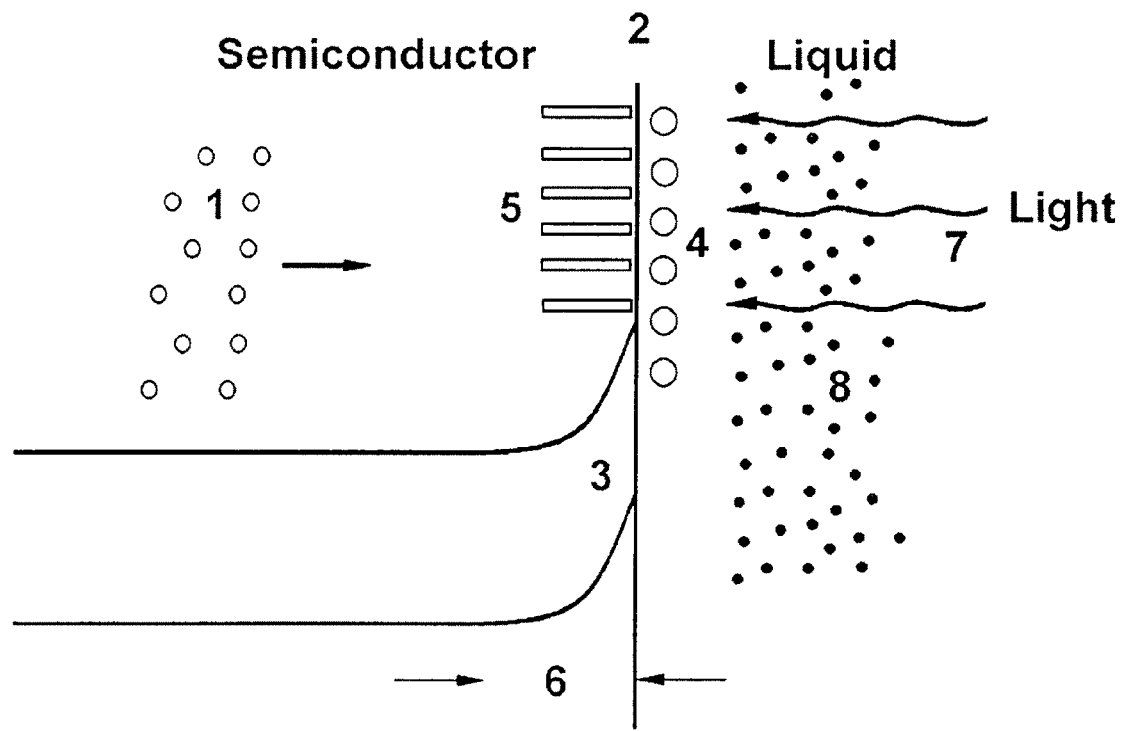
FIG. 1 illustrates the process of photo-modification.

Further scope of applicability of the present invention will become apparent from the detailed description given hereafter. However, it should be understood that the detailed descriptions and specific examples, while including the preferred embodiments of the invention, are given by way of illustration only, since various changes and modifications within the spirit and scope of the invention will become apparent to those skilled in the art from this detailed description.

DESCRIPTION OF PREFERRED EMBODIMENTS

The preferred embodiments are related to fabrication of the semiconductor nanocomposite materials incorporating aligned metal or semiconductor nanowires using the process of photo-modification of the semiconductor material and application of these semiconductor nanomaterials in electronic, optoelectronic, photonic, and plasmonic devices. The aligned metal or semiconductor nanowires are self-assembled from metal or semiconductor interstitial defect atoms, which are either inherently present in the semiconductor or artificially introduced in the preferred matrix semiconductor material.

The process of photo-modification can be explained as follows. Any exposed surface of semiconductor has a set of incomplete covalent bonds, which are available for strong interactions with atoms and molecules of the ambient. The density of such bonds at the surface is about $10^{15}$ cm$^{-2}$. The appearing surface states having electron energy levels within the energy bandgap are known as Tamm states. An actual surface usually has $10^{11}$ cm$^{-2}$ detectable states, which is a rather large number. For comparison, the density of electrons in a nearly intrinsic material is only $10^7$ cm$^{-3}$. The surface states can either give or receive electrons, thus connecting the ambient to the crystal.

As a result of the surface states, energy bands are usually bent near surface. If the surface state traps an electron, it acts as an acceptor, and bands are bent upward at the surface. If the donor-like trap can lose an electron, forming a positive charge at the surface, it causes the bands to bend down.

The band bending can be enhanced by impurities. If a gas atom or molecule approaching the surface has greater electron affinity than the work function of semiconductor, then it may capture an electron from the surface and, thus behaving as an acceptor, will bend the bands upwards. Therefore, employing appropriate dopants one can strongly enhance the near-surface band bending.

The Fermi energy is to be pinned: electrons from the valence band fall into the surface states until the Fermi energy coincides with the level to which the surface states are filled. In intrinsic semiconductors the near-surface band bending can approach one half of bandgap. For example, in intrinsic gallium arsenide the band bending causes a natural surface depletion and a potential across the semiconductor of about 0.6 V. It heavily n-doped semiconductors the bending may be approximately equal to the bandgap energy.

The process of photo-modification of a semiconductor material is schematically illustrated in FIG. 1. All compound semiconductor materials, such as GaAs, ZnSe or CdS, contain charged self-interstitial metal defects 1 (Ga, Zn, Cd). In other semiconductor materials, such as PtSi the interstitial metal defects could be introduces artificially using, for example, the technique of ion implantation or diffusion.

During photo-modification of near-surface region 2 the defects are pulled down to the surface by strong electric field of the near-surface band bending 3 enhanced by surface acceptors 4 dissolved in a highly polar liquid 8. On approaching surface region 2, the charged interstitial defects 1 capture photogenerated electrons from conduction band of the semiconductor and form growing neutral metal nanowires 5 aligned in the direction of electric field perpendicular to the surface.

Because there are no free electrons in depleted region 6 of the near surface band bending, in order to initiate the modification process one should photogenerate them by illuminating the surface of semiconductor with light 7 at the fundamental absorption wavelength making the electrons in conduction band available for formation of neutral nanowires. Therefore, formation of the nanowires takes place only in the regions illuminated with the light. Though light at the fundamental absorption wavelength does not penetrate deeply inside the semiconductor, the photogenerated electrons moving away from the surface due to band bending can penetrate inside semiconductor at the diffusion length before they meet holes and recombine. For example, the electron diffusion length in GaAs is about 10 μm. This depth is more than sufficient for most applications.

The presence of liquid plays an important role. Due to Frank-Condon splitting of energy levels in the oscillating field of highly polar liquid, the process of nanowire formation becomes irreversible. This ensures extremely high stability of the nanowire structures self-assembled in the near-surface region of semiconductor material. Thus, the process of photo-modification allows self-assembling of highly stable aligned metal nanowire structures in semiconductor material in the regions illuminated with the light and being in contact with highly polar liquid having appropriate acceptors.

Depth of the modified region depends on the density of surface states, concentration of surface acceptors, concentration of free carriers in the semiconductor (doping), light intensity and duration of the photo-modification process. The depth of depletion layer resulting from the near-surface band bending can be estimated by solving the Poisson equation as follows:

$$l_d = (2\epsilon\epsilon_0 V/eN)^{1/2},$$

where $\epsilon$ is the dielectric constant of material, V is the voltage across the semiconductor due to band bending, e is the electron charge and N is the electron concentration. In the case of n-doped GaAs with doping concentration of $N=10^{17}$ cm$^{-3}$, substituting in the above formula $\epsilon=12.9$ and $V=0.6V$, we obtain $l_d=92$ nm. However, in n-doped GaAs with doping concentration of about $N=10^{13}$ cm$^{-3}$ the depth of depletion layer can approach 10 μm.

In GaAs the self-interstitial Ga defects can be moved to the surface if electric field of the near surface band bending E is stronger than 1 kV/cm. Therefore, maximum thickness of the band bending region, at which built-in electric field is capable to move interstitial defects, can be estimated as $l=V/E$. At $V=0.6$ V and $E=1$ kV/cm the thickness can approach 6 μm.

The metal nanowires change refractive index of the semiconductor material in its near-surface region 6 dramatically. Therefore, the process of nanowires formation can be conveniently monitored by measuring the refractive index in near-surface region of the semiconductor crystal.

In preferred embodiment of the process of photo-modification one can employ strong built-in electric field of p-n junction or Schottky barrier at the interface between the semiconductor material and a metal electrode deposited on the semiconductor instead of using the near-surface band bending due to surface states. The built-in electric field of the Schottky barrier works quite similar to the field of near-surface band bending shown in FIG. 1.

Figure 2:
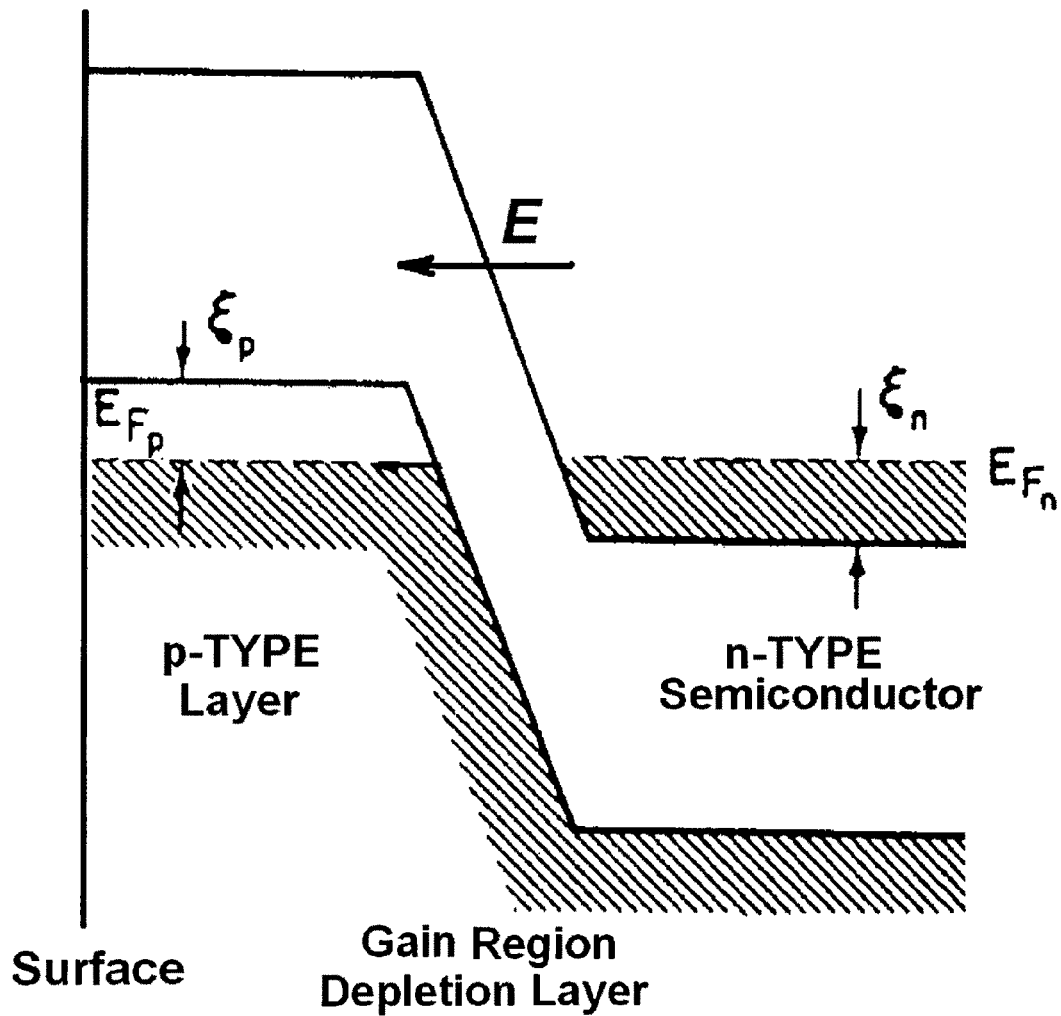
FIG. 2 illustrates near-surface band bending due to p-n junction in a laser diode.

FIG. 2 illustrates the preferred embodiment of the process of photo-modification employing the built-in electric field of a p-n junction, for example, p-n junction of heterostructure used in laser diodes. The laser diode structure has a gain region comprising multiple quantum wells and having thickness much smaller than 1 μm, as shown in FIG. 2. The gain region is sandwiched between heavily doped n-type semiconductor and heavily doped p-type surface layer having thickness of about 1 μm. The laser chip is usually mounted on a heat sink p-layer down to remove heat generated during laser operation.

The p-type surface layer having thickness of about 1 μm and dopant concentration of $N_p=10^{19}$ cm$^{-3}$ contains $10^{15}$ holes per square centimeter of its surface. Because the number of holes exceeds the maximum density of surface states ($10^{11}$ cm$^{-2}$) the negative surface charge created by acceptors absorbed at the surface will be compensated by holes screening electric field in the near-surface region. Therefore, the band bending is absent in heavily p-doped near-surface layer.

In the case of photo-modification of the laser diode structure, the depletion region is created by p-n junction of the heterostructure located at a distance of about 1 μm form the surface of semiconductor. The p-n junction creates band bending with very strong built-in electric field E, as shown in FIG. 2. For example, in GaAs laser diode structure having bandgap of about 1.4 eV and thickness of the depletion layer $d\ll1$ μm, the electric field $E=V/d\gg14$ kV/cm. The electric field pulls the interstitial Ga ions out of the gain region into near-surface p-type layer of the structure. Illumination of the laser diode surface with light at the fundamental absorption wavelength creates free electrons in the conduction band. The oscillating field of highly polar liquid helps Ga ions to capture these electrons from the conduction band. This supports formation of neutral Ga nanowires growing in the p-type layer in the direction of electric field and changing refractive index in the light illuminated area.

In the case of modification employing the Schottky barrier or p-n junction, the use of polar liquid containing surface acceptors is not necessary. In that case the photo-modification can be performed in the air or vacuum. Instead of taking advantage of oscillating electric field of molecules of the polar liquid, one may employ an external AC electric field oscillating at the frequencies exceeding inverse lifetime of electrons or holes. Because sufficiently strong built-in electric field would spatially separate the photogenerated electron-hole pairs much faster than they could possibly recombine, the frequency of oscillating external AC electric field is determined by lifetime of free charge carriers. In GaAs the lifetime is typically 5 $10^{-9}$ s for electrons and 3 $10^{-6}$ s for holes. Amplitude of the electric field should be sufficient for capture of the corresponding photogenerated carriers (electrons or holes) by charged interstitial defect atoms. Such an oscillating electric field can be realized either by modulating the applied voltage or using electromagnetic radiation. The photo-modification can be performed either at room temperature or at elevated temperature to facilitate moving of the interstitial defects inside the semiconductor material.

Thus, the process of photo-modification is quite general. It can be applied to many compound semiconductors, including GaAs, AlGaAs, InGaAsP, InP, GaP, GaN, ZnSe, ZnS, ZnO, HgCdTe, CdTe, InSb, GaSb, InAs, AgBr, AgF, AgCl, CdS, comprising charged self-interstitial defect atoms, from which the nanowires are to be self-assembled. It can also be applied to such matrix semiconductor materials as Si, Ge and various organic semiconductors, in which foreign charged interstitial defect atoms can be artificially introduced for self-assembling from them corresponding nanowires.

In order to perform the photo-modification one should apply sufficiently strong electric field to move the charged defects in the direction of electric field and spatially separate photogenerated electron-hole pairs and also apply an additional AC electric field having sufficiently large magnitude to ensure capture of the photogenerated electrons (holes) from corresponding conduction (valence) band by the charged interstitial defect atoms resulting in formation of neutral nanowire material and having frequency exceeding the inverse lifetime of the photogenerated electrons (holes). The semiconductor material should be illuminated with the light having wavelength and intensity that ensure photogeneration of sufficient amount of electrons (holes) in the semiconductor material. This supports conversion of the charged defects into neutral atoms of growing nanowires. The process should be continued during the time required for self-assembling the nanowires of required size.

In the preferred embodiment highly ordered arrays of the self-assembling nanowires are fabricated by illuminating the semiconductor material trough special templates defining specific positions of individual nanowires. Such templates placed on surface of the semiconductor or at certain distance form the surface can be made, for example, from thin metal films having a periodic array of nanoholes, which transmit the near-field light due to plasmon effects employing surface plasmon polaritons (SPPs). SPP is a hybrid of electromagnetic field and electrical currents bound to the surface of a metal. In gold or silver the surface plasmons propagate for hundreds of wavelengths along channels formed by the nanoholes. Being scattered by properly arranged holes, they can form "hot" spots at large distance form the surface produced by long-range interference. This self-imaging of the array of holes at distant points is a plasmon analog of Talbot effect. For fabrication of individual nanowires one can also illuminate surface of the semiconductor with a near-field hot spot created at the end of a very thin metal needle or at a tip of near-field scanning optical microscope.

Light in the near-field hot spot has very small focusing depth due to strong diffraction effects. Therefore, in the case of fabrication of the nanowires or nanowire arrays employing the near-field light, the modification should be performed at the wavelength corresponding to strong fundamental absorption in the semiconductor material. This prevents deep penetration of the light inside semiconductor material. Charge carriers photogenerated in hot spots at the surface of semiconductor are moved inside the material by built-in electric field supporting formation of the nanowires aligned in the direction of this field. Because the diffusion length of free carriers in semiconductors can be rather large (about 10-30 µm), this technique allows fabrication of sufficiently long nanowires. Diameter of the fabricated nanowires is basically defined by size of the light hot spot and lateral diffusion of the photogenerated charge carriers.

In another preferred embodiment surface of the semiconductor material is processed with electron or ion beam through the template comprising periodic array of nanoholes in order to create additional defects on the semiconductor surface enhancing photo-modification in seed points, in which the nanowires are to be self-assembled.

The aligned nanowires and nanowire arrays fabricated using the described process of photo-modification can find numerous applications in various electronic, optoelectronic, photonic, and plasmonic devices. Some examples on these devices are presented below.

In the preferred embodiment the nanostructured semiconductor materials comprising self-assembled array of aligned metal nanowires are used as grid light polarizers. The metal grid spacing is much smaller that the light wavelength. Therefore, for the light propagating either along modified surface or passing through the semiconductor material under some angle to the surface, the nanostructured semiconductor material transmit the light component polarized perpendicular to nanowires and reflects the light component polarized parallel to nanowires.

Figure 3:
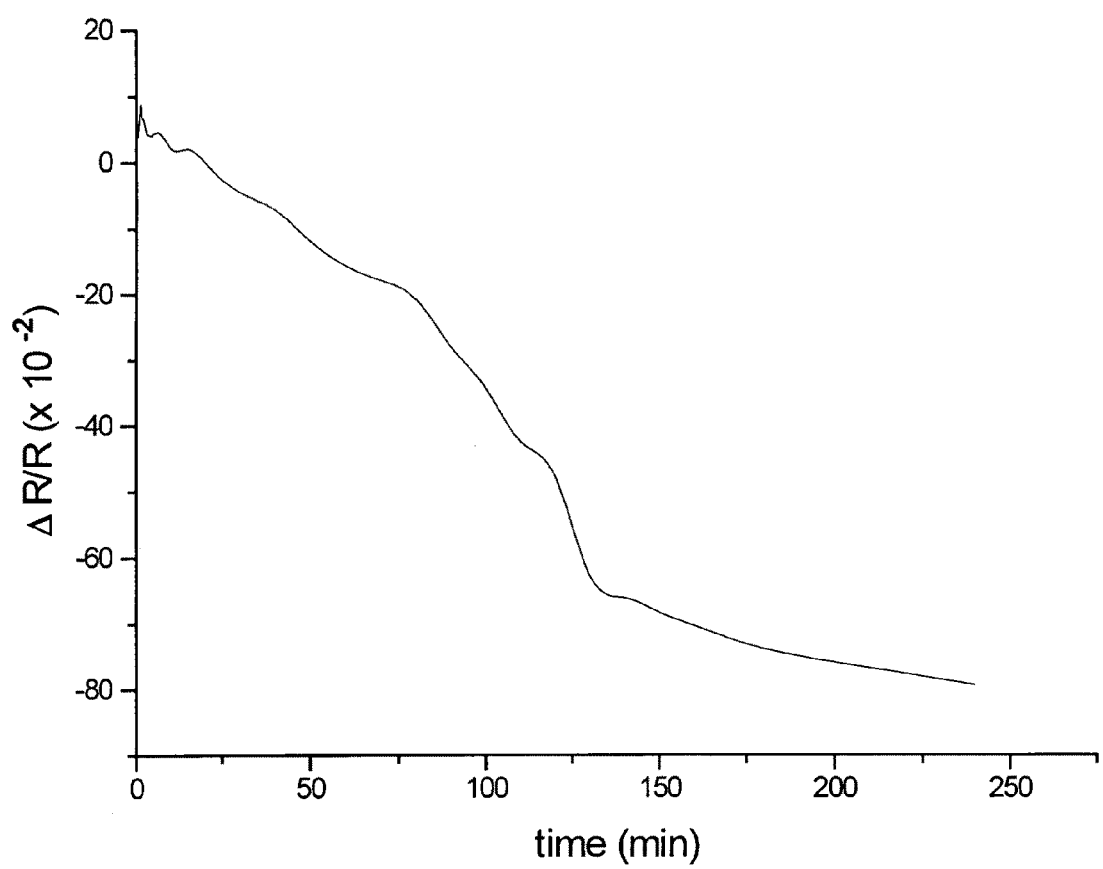
FIG. 3 shows relative change of the coefficient of reflection $\Delta R/R$ from GaAs surface as a function of modification time.

Because formation of the metal nanowires in semiconductor materials results in dramatic change of the material refractive index in the regions illuminated with the light, this property can be used for holographic recording of various gratings and waveguide structures in the semiconductors materials defined by the photoinduced refractive index contrast. The large change of refractive index during photo-modification can be conveniently monitored by measuring reflection coefficient from semiconductor surface at the fundamental absorption wavelength characterizing true reflection. FIG. 3 shows the measured relative change of reflection coefficient for GaAs crystal as a function of processing time.

At the very beginning (during the first two minutes) of the photo-modification process the refractive index in near-surface region of the semiconductor slightly increases. This effect can be explained by increasing concentration of the interstitial Ga in the near surface region changing its stoichiometry. At longer modification time the refractive index dramatically decreases due to formation of the aligned metal nanowires. Maximum observed decreasing of the refractive index was $\Delta n=0.8-0.9$.

Figure 4:
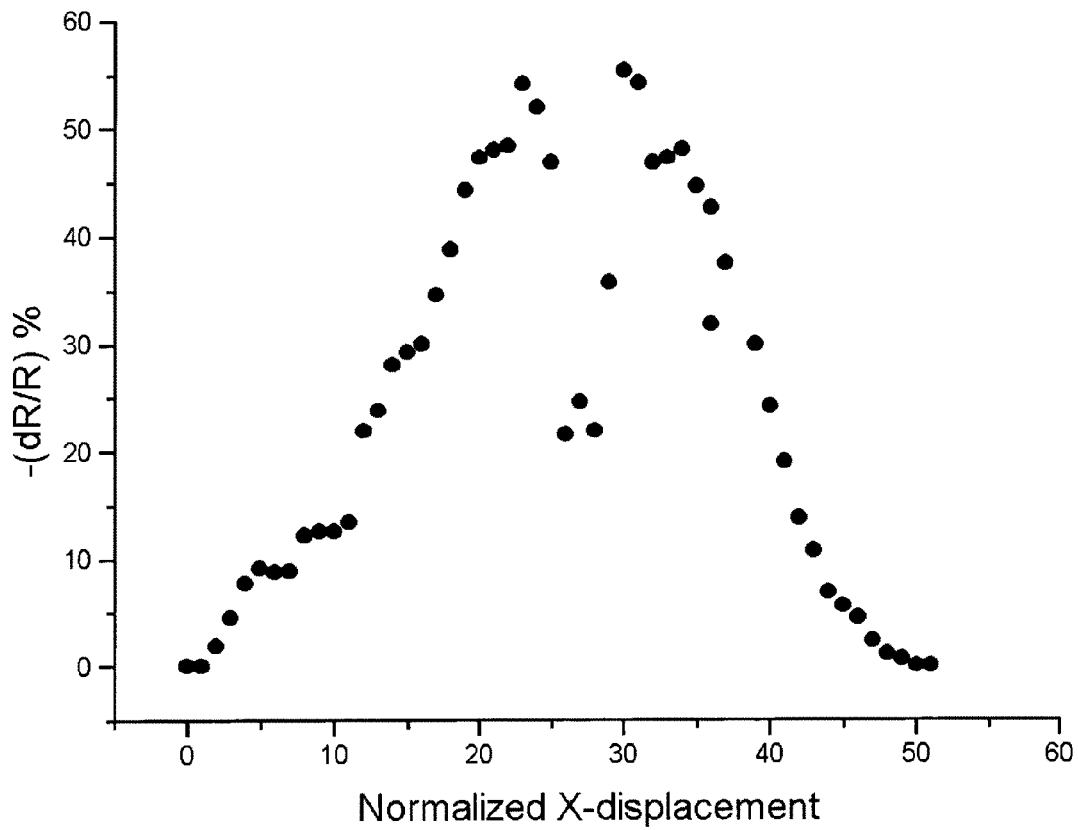
FIG. 4 shows negative reflection coefficient $-(\Delta R/R)$ as a function of the normalized transverse displacement of a probe laser beam.

At sufficiently long modification time the processed region could be visually observed on the surface of GaAs crystal as a spot having size of the laser beam. The spot has a ring-like shape indicating that the modification is not uniform across the Gaussian laser beam. It depends on intensity distribution in the beam. FIG. 4 shows typical result of scanning a focused probe laser beam across the modified region. The negative relative variation of reflection coefficient $-(\Delta R/R)$ is shown as a function of the normalized transverse displacement of the probe laser beam.

The result demonstrate that the change of Fresnel reflection coefficient, and hence the change of the refractive index, generally increase with intensity of the modifying beam. However, at too high light intensity in the central region of the Gaussian laser beam the change of refractive index is much smaller. This suggests that photogeneration of too large amount of free carriers results in screening of the built-in electric field. Therefore, the modification process does not require high light intensity and it should be carefully optimized for achieving the best results.

Figure 5:
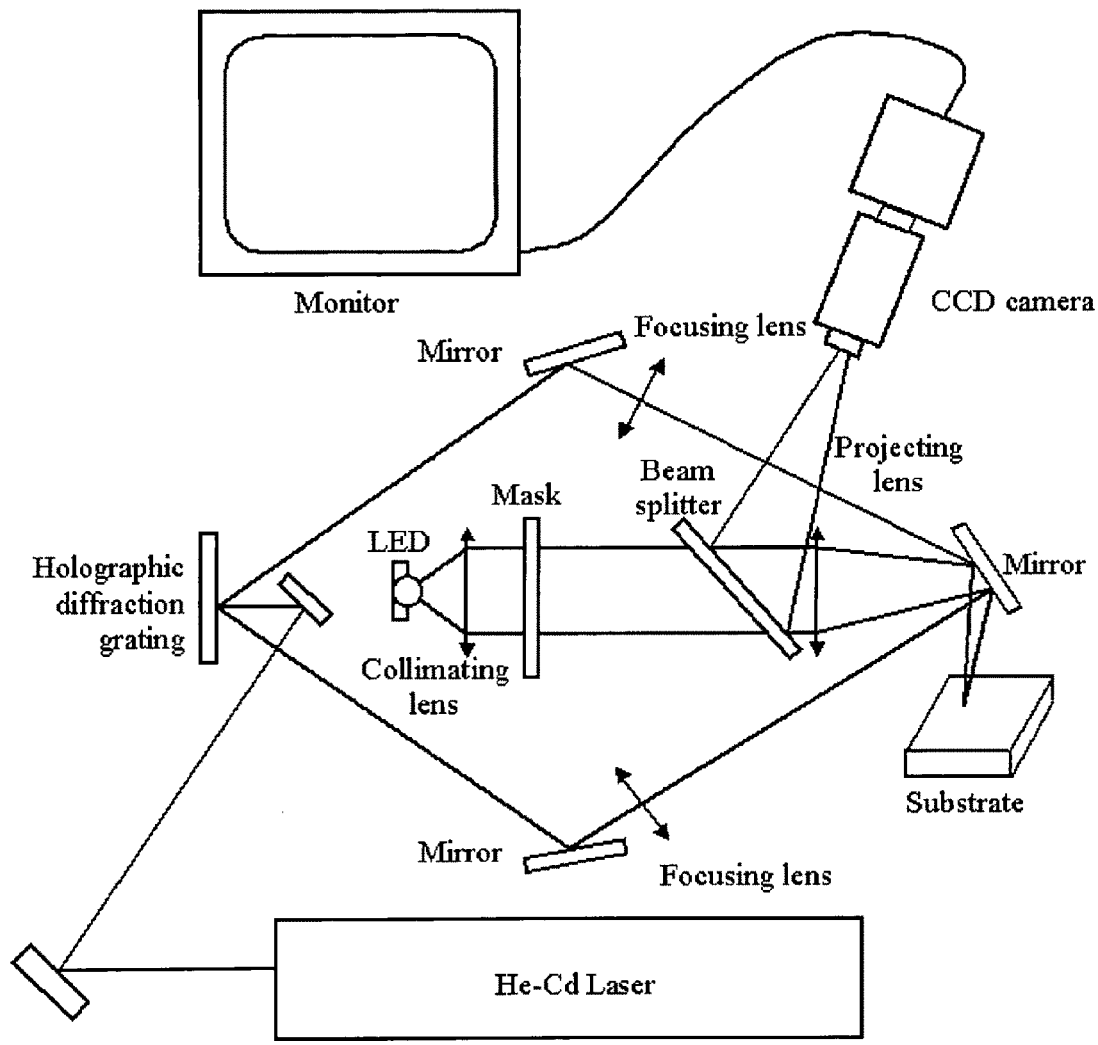
FIG. 5 shows schematic of setup for photo-modification.

In the preferred embodiment the technology of photo-modification is used for holographic recording of relief-free photonic crystal structures, integrated optical waveguides and Bragg filters in semiconductor crystals, such as GaAs or InP, commonly used for optical processing of information and wavelength division multiplexing. FIG. 5 shows an example of setup for recording of the integrated optical waveguides and periodic structures in the semiconductor material using the process of photo-modification.

Figure 6:
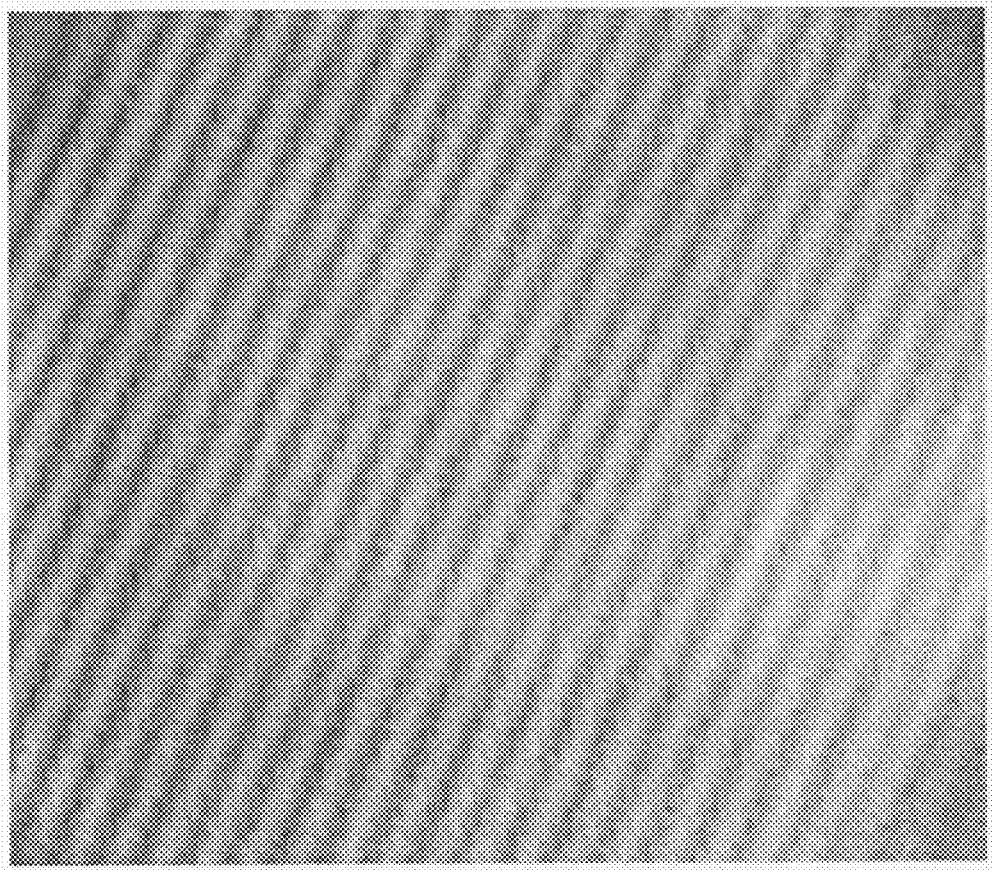
FIG. 6 shows holographic diffraction grating recorded on GaAs substrate.
Figure 7:
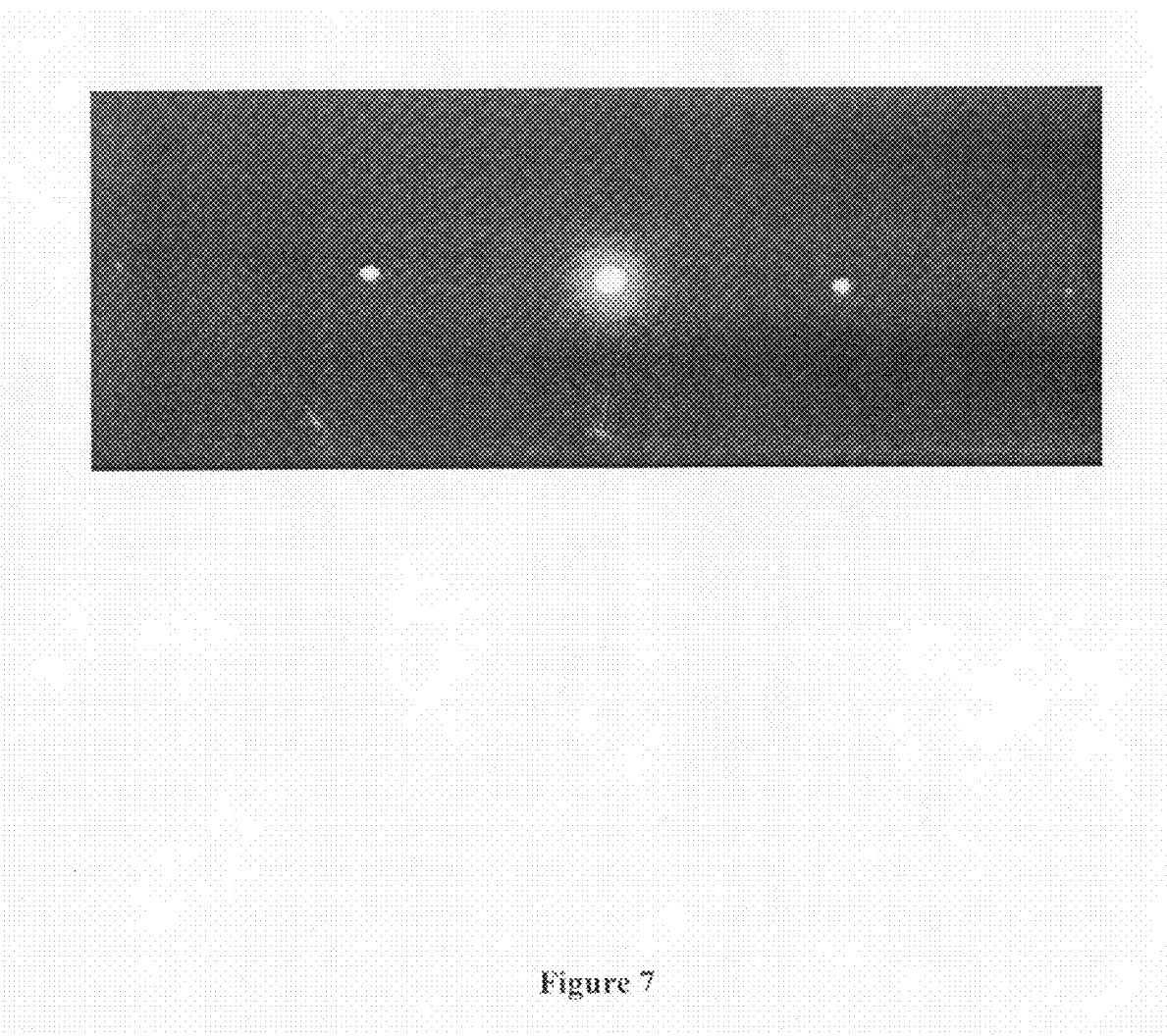
FIG. 7 shows diffraction of a probe laser beam reflected form grating shown in FIG. 6.

The optical waveguide structure is projected on the surface of semiconductor using the light from powerful LED and a photomask defining geometry of the structure. The periodic structures in semiconductor materials are holographically recorded using interference of laser beams. FIG. 6 shows photo picture of the periodic structure with period of a few microns recorded in GaAs semiconductor crystal using this technique. FIG. 7 shows diffraction of a probe laser beam reflected from the recorded grating. Such waveguides and gratings recorded in semiconductor materials are especially useful for optical signal processing at wavelengths 1.3 and 1.55 μm used in telecommunications.

Figure 8:
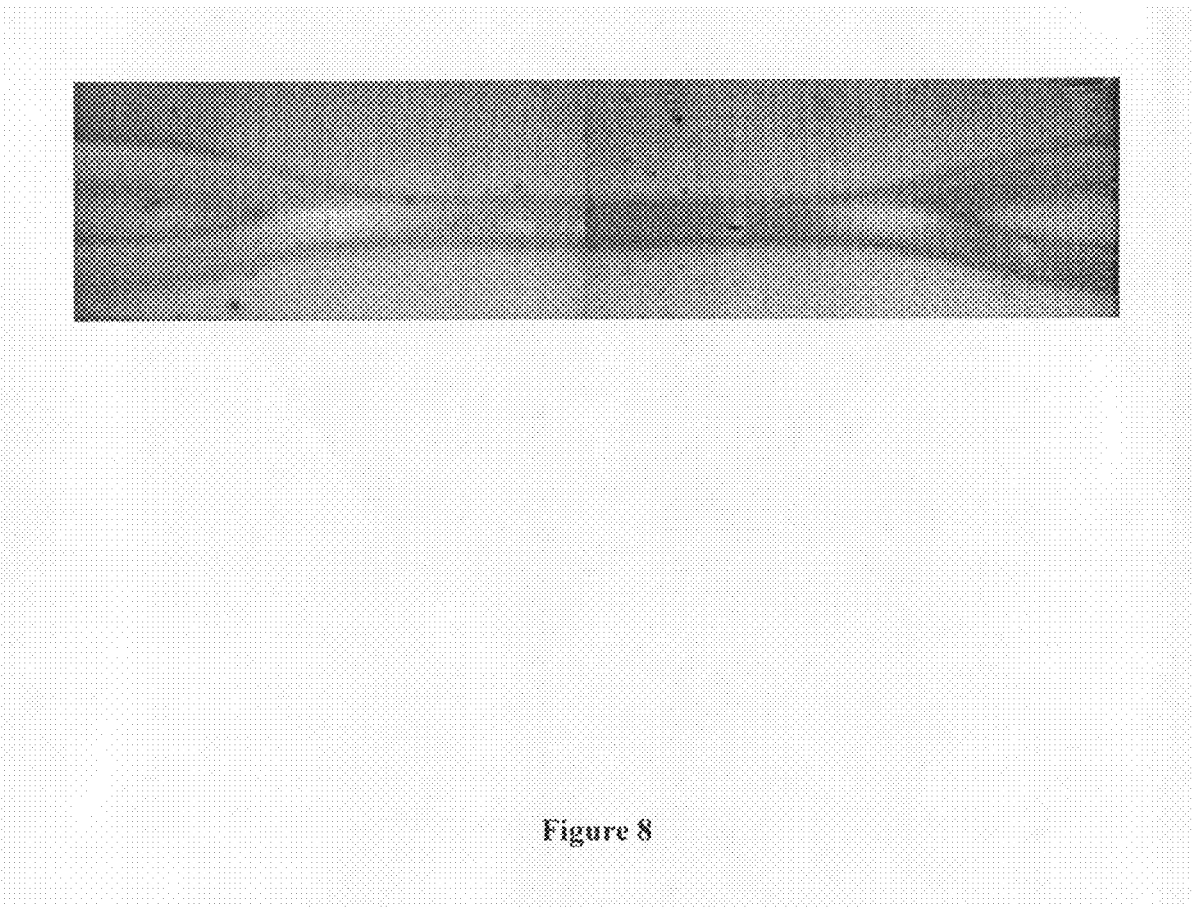
FIG. 8 shows a channel waveguide structure recorded on GaAs substrate.
Figure 9:
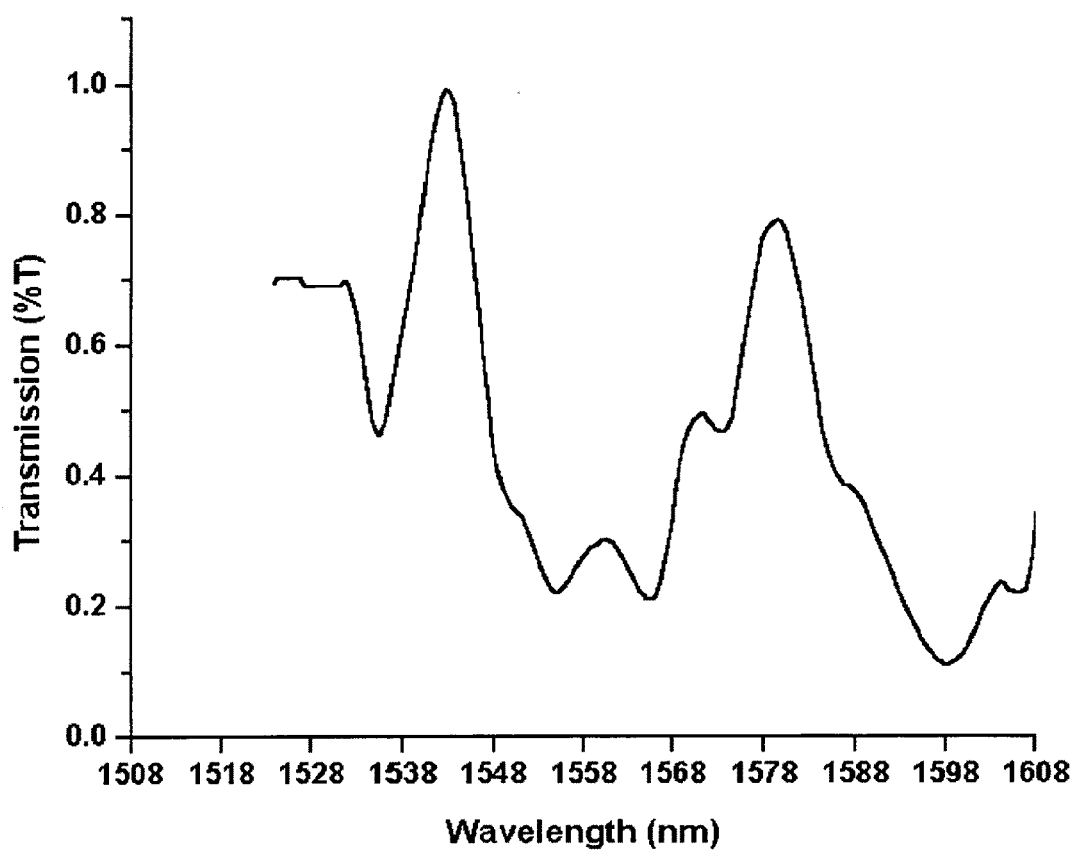
FIG. 9 shows transmission spectrum for GaAs channel waveguide with Bragg filter.

FIG. 8 shows an example of relief-free waveguide structure recorded on GaAs substrate. Because the nanowires decreasing the material refractive index are fabricated only in cladding region of the waveguide and the light propagates mostly in core region made of pristine GaAs, the photo-modification process does not introduce much additional losses. FIG. 9 shows spectrum of the light transmitted through such a waveguide having one-dimensional photonic crystal operating as a Bragg grating filter. The grating period was 245 nm. A broadband Amplified Spontaneous Emission laser source has been used for excitation of the waveguide. Transmission spectrum of the channel waveguide with Bragg grating exhibits a photonic bandgap in the vicinity of 1558 nm having the width of about 20 nm.

In the preferred embodiment the photonic crystal structure with high refractive index contrast is recorded in p-layer (shown in FIG. 2) of a laser diode chip before mounting it onto a heat sink. Recording of the periodic structure in close proximity to active region of p-n junction of laser diodes, such as high power laser diodes based on GaAs or InP materials, allows fabrication of new generation of photonic crystal lasers exhibiting improved beam quality, increased spectral brightness, thermal stability and reliability.

Figure 10:
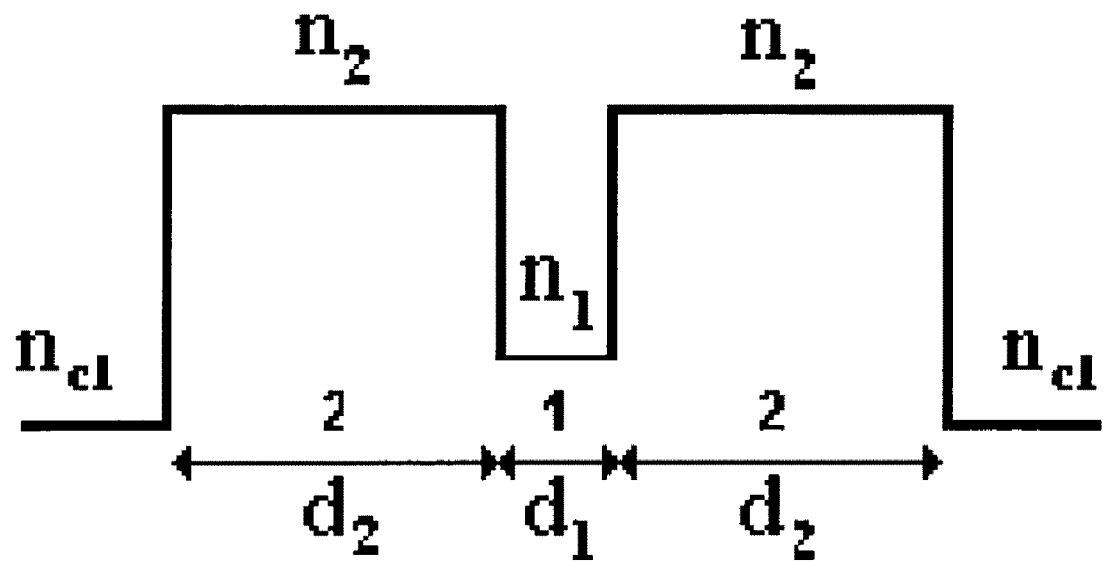
FIG. 10 shows refractive index profile of compound waveguide.
Figure 11:
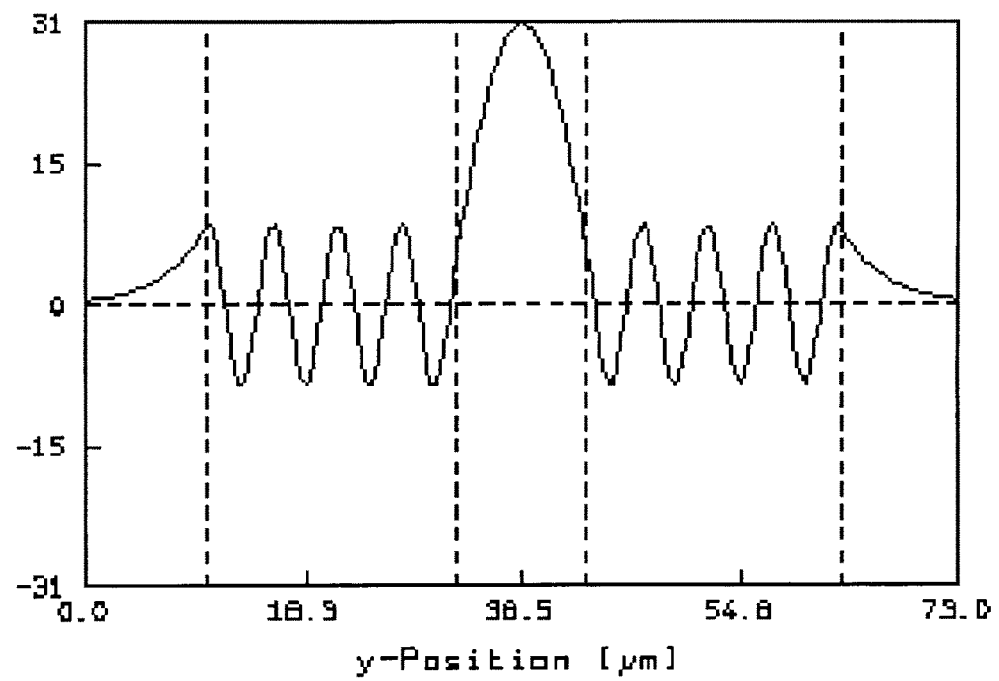
FIG. 11 shows high order mode with sharp peak in the compound waveguide shown in FIG. 10.

In another preferred embodiment a waveguide structure is recorded in active region of the laser diode in order to form waveguide mode having the required field distribution in lateral direction. FIG. 10 shows an example of refractive index distribution in compound waveguide structure that can be recorded in active region of the laser diode to ensure generation of the higher order waveguide mode shown in FIG. 11, which has large cross section and sharp central peak concentrating much of the laser beam power.

In the preferred embodiment the process of photo-modification is employed for cleaning from interstitial defects the specific regions of said semiconductor matrix material illuminated with the light by moving the charged self-interstitial defect atoms away from these regions. Such cleaning form defects of the photovoltaic materials, solar cells and active region of p-n junction in semiconductor laser diodes and light emitting diodes results in improving performance of the optoelectronic devices.

In another preferred embodiment the decreasing of refractive index during photo-modification is used for optical recording of various components of diffractive optics in semiconductor materials transparent at the infrared wavelengths, such as ZnSe, ZnS and GaAs. The infrared optics finds numerous applications in modern photonic devices.

It is known that thick and bulky optics is generally not required to control light. The light can be efficiently controlled after propagation through a very thin structure having just a fraction of light wavelength in thickness. Optical components taking advantage of this property are called diffractive optics or diffractive optical elements (DOE). They offer a distinct advantage by dramatic material saving, coupled with weight and cost reductions. DOE can also be used to correct imperfections of traditional bulk optics or to perform light control functions that the bulk optics could not perform.

The diffractive optics based on semiconductor materials transparent at the infrared wavelengths is usually fabricated employing etching technique for creating a surface relief on thin plates of the semiconductor material. The difficulty of etching, handling and cleaning of the components having the deep surface relief makes them impractical in many applications, especially in field conditions.

Etching of deep relief on the surface of semiconductor becomes challenging when depth of the relief considerably exceeds its scale (period). Such deep relief is required for fabrication of subwavelength components having period smaller than light wavelength and operating, for example, in middle wavelength infrared (MWIR) and long-wavelength infrared (LWIR) regions of 3-12 microns, including the important windows of atmospheric transparency. Etching of deep relief with accurately controlled sinusoidal shape for infrared diffraction gratings is also difficult. Any departure from perfect sinus-like relief shape results in losses due to light scattering into undesirable higher diffraction orders.

Fabrication of relief-free diffractive optics requires changing the refractive index inside the semiconductor material for optical phase modulation. Because light at the fundamental absorption wavelength could not penetrate deeply inside semiconductor material the technology of photo-modification should be generalized to allow recording of the refractive index at wavelengths, at which the semiconductor material is sufficiently transparent.

The photo-modification at wavelength of material transparency is also required for optical recording of volume phase holographic structures and physical holograms in various components, for example, in integrated optical waveguides based on semiconductor materials, such as GaAs. The volume phase holographic gratings (VPHG) are more efficient than surface diffraction gratings. In addition, many components for signal processing would benefit from a means for recording of physical holograms using the light at wavelength of device operation. It is well known that physical holograms can automatically account for all particularities of the device and compensate possible imperfections. This property is used, for example, in the systems employing optical phase conjugation. Recording the volume phase holographic gratings and components operating at the telecommunication wavelengths of 1.3 and 1.5 μm is of special interest.

The photo-modification at wavelength of material transparency can be performed using the nonlinear process of two-photon absorption. Though photo-modification employing two-photon absorption generally requires sufficiently high light intensity, the physical holograms inside integrated optical components of small cross section can be recorded using CW lasers having only a few mW of power.

Photo-modification of semiconductors at the wavelength of fundamental absorption takes place due to photogeneration of electrons in the conduction band and usually requires the light intensity of about $I_0$=10-100 mW/cm$^2$. Two-photon modification would need much higher intensity I for generation of the same amount of free electrons due to nonlinear two-photon absorption than in the case of fundamental absorption. The evolution of the carrier density N is described as $$dN/dt=(\alpha/h\nu)I+(\beta/2h\nu)I^2,$$

where I is the intensity of light, $\beta$ is the coefficient of two-photon absorption, $\alpha$ is the coefficient of one photon absorption, $\nu$ is the light frequency and h is the Plank constant. Therefore, the light intensity I required for generation of the same amount of free electrons due to two-photon absorption as in the case of one-photon absorption can be estimated as $$I=[(2\alpha/\beta)I_o]^{1/2}.$$

For example, for GaAs at wavelength 1.5 μm, β=24 cm/GW and α=8000 cm$^{-1}$. Therefore, the two-photon modification is possible at the intensity as low as 2.6 10$^8$ mW/cm$^2$.

For ZnSe β=5 cm/GW at wavelength λ=650 nm, β=2 cm/GW at wavelength λ=800 nm, and it practically vanishes at λ>900 nm. Substituting in the above formula I$_0$=10 mW/cm$^2$ and α=2 10$^4$ cm$^{-1}$ we estimate the intensity required for two-photon modification of ZnSe at λ=650 nm as 2.8 10$^8$ mW/cm$^2$. This intensity can be easily achieved by tight focusing of CW laser beam. The possibility of recording the physical holograms in semiconductor materials at the wavelength of device operation adds new functionality to many photonic devices, including waveguide components for wavelength division multiplexing, Bragg filters, feedback gratings in laser diodes, etc.

Fabrication of infrared diffractive optics having diameter of a few centimeters using the process of two-photon modification would require too high light power. Moreover, the infrared optics operating at long infrared wavelengths can be conveniently recorded using visible or UV wavelengths corresponding to strong material absorption and providing much better accuracy of the recorded pattern. Therefore, in the case when recording does not necessary need to be performed at the wavelength of device operation it is preferable to use one-photon modification.

The one-photon photo-modification inside semiconductor material can be performed at the wavelengths corresponding to edge of the fundamental absorption band, at which the semiconductor material is sufficiently transparent and the recording light can deeply penetrate inside the semiconductor. For applications, which do not necessarily require recording of physical holograms at the wavelengths of device operation, this new regime of modification is more practical, because it needs much lower light intensities than the process of two-photon modification.

In the preferred embodiment the large change of material refractive index during photo-modification is used for fabrication of diffractive optics employing various volume phase structures recorded in semiconductor materials using sophisticated computer-generated photo-masks. Operation of the components of diffractive optics requires phase modulation up to π for the light at wavelength λ. Therefore, for application in diffractive optics the refractive index change Δn and depth d of the modified semiconductor material should obey the following condition:

$$2\pi \Delta n d/\lambda \geq \pi \text{ or } \Delta n \geq \lambda/2d, \ d \geq \lambda/2\Delta n.$$

For example, at the demonstrated change of refractive index in polycrystalline ZnSe material of Δn=0.74, the depth of modification of about 0.7 μm is sufficient for fabrication of diffractive optics operating at wavelength of YAG laser 1.064 μm having many industrial applications. Diffractive optics for wavelength 1.55 μm requires the modification depth of about 1 μm. For diffractive optics operating at wavelength of 10.6 μm, the depth of modified layer should be about 7 μm. By employing reflection mode of operation taking advantage of double path through the modified layer one can decrease the required depth of modification in two times down to 3.5 μm. Thus, the technology can be used for fabrication of diffractive optics operating at MWIR and LWIR wavelengths, including the important windows of atmospheric transparency of 3-5 and 8-12 μm.

Many devices employ structures, in which refractive index changes periodically in space. The structures having period larger than half wavelength of the light are used in diffractive optics, while the structures with subwavelength periodicity much smaller than the light wavelength can be used as materials with artificial birefringence for design of phase retardation plates, half-wavelength (λ/2) and quarter-wavelength (λ/4) waveplates to control light polarization.

The diffraction grating is one preferred embodiment of the diffractive optics. The diffraction gratings find numerous applications in various spectral devices and sensors. The volume phase diffraction gratings exhibiting high diffraction efficiency represent a special interest for practical applications. The first order diffraction efficiency of the volume phase holographic grating at normal incidence of probe beam depends on refractive index contract Δn and depth of the grating d as follows:

$$\eta = \sin^2(\pi \Delta n d/\lambda).$$

For example, at refractive index contrast in grating fringes of Δn=0.8 and depth of modification of d=6 μm the diffraction efficiency at wavelength 10 μm should be about η=0.99. For semiconductor materials, which are transparent at infrared wavelengths, the recorded grating can operate in both the reflection and transmission modes.

The subwavelength volume phase holographic gratings having period much smaller than the wavelength of infrared light operate as a material exhibiting artificial birefringence. In another preferred embodiment the photo-modification technology is employed for fabrication of infrared components taking advantage of the artificial birefringence in semiconductor materials, including phase retardation plates, half-wavelength and quarter-wavelength waveplates.

The subwavelength volume phase holographic grating can be modeled as a periodic system of layers of equal thickness with refractive indices $n_1=n$ and $n_2=n-\Delta n$, where n is the refractive index of semiconductor and Δn is the change of refractive index in grating fringes after modification. Effective refractive indices for the beam polarized parallel and perpendicular to the direction of grating fringes respectively can be calculated as follows:

$$n_= = [(n_1^2+n_2^2)/2]^{1/2} \text{ and } n_+ = [(1/n_1^2+1/n_2^2)/2]^{-1/2},$$

where $\Delta n_{BR}=n_= - n_+$ is the artificial birefringence introduced by the grating. The artificial birefringence can be used, for example, for rotation of polarization of a light beam.

In another preferred embodiment the decrease of refractive index during photo-modification is used for fabrication of highly stable anti-reflection layers on semiconductor materials without depositing any foreign coatings on their surface. The foreign coatings are undesirable, for example, for components operating at cryogenic temperatures due to mismatch in the coefficients of thermal expansion compromising the coating integrity. The anti-reflection layer on material with refractive index n must have the refractive index $n_{AR}=(n)^{1/2}$ in order to ensure destructive interference of the light reflected from its front surface being in contact with air and form back surface. It means that the decrease of refractive index after photo-modification Δn and minimum thickness of the anti-reflection layer d should obey the following conditions:

$$\Delta = n - n_{AR} = n - (n)^{1/2} \text{ and } d = \lambda/(4n_{AR}) = \lambda/(4 n^{1/2}),$$

where λ, is the wavelength of light. For example, the refractive index of ZnSe at wavelength λ=10.6 μm is n=2.4 and the refractive index required for antireflection is $n_{AR}=(n)^{1/2}=1.55$. Therefore, the thickness of antireflection layer is d=1.7 μm. The required decrease of refractive index of Δn=0.85 is close to the refractive index change that have been already experimentally demonstrated during photo-modification of semiconductor materials.

In the preferred embodiment the diffraction grating, Bragg filters or periodic structures with large-scale periodicity are recorded inside, on side surface or on end face of optical fibers made of semiconductor materials, such as AgBr and AgCl, which are employed for transmission of mid-IR light. The diffraction gratings and Bragg filters are used in IR sensors and spectral devices. In one preferred embodiment the diffraction gratings recorded inside the infrared optical fiber, on its side surface or on end face are used for coupling the light into the fiber or out the fiber. The large-scale periodicity inside the fiber can also be used for coupling between fiber modes. In another preferred embodiment the process of photo-modification is employed for fabrication of anti-reflection layer on the end face of infrared optical fibers made of semiconductor materials, such as AgBr and AgBr.

Figure 12:
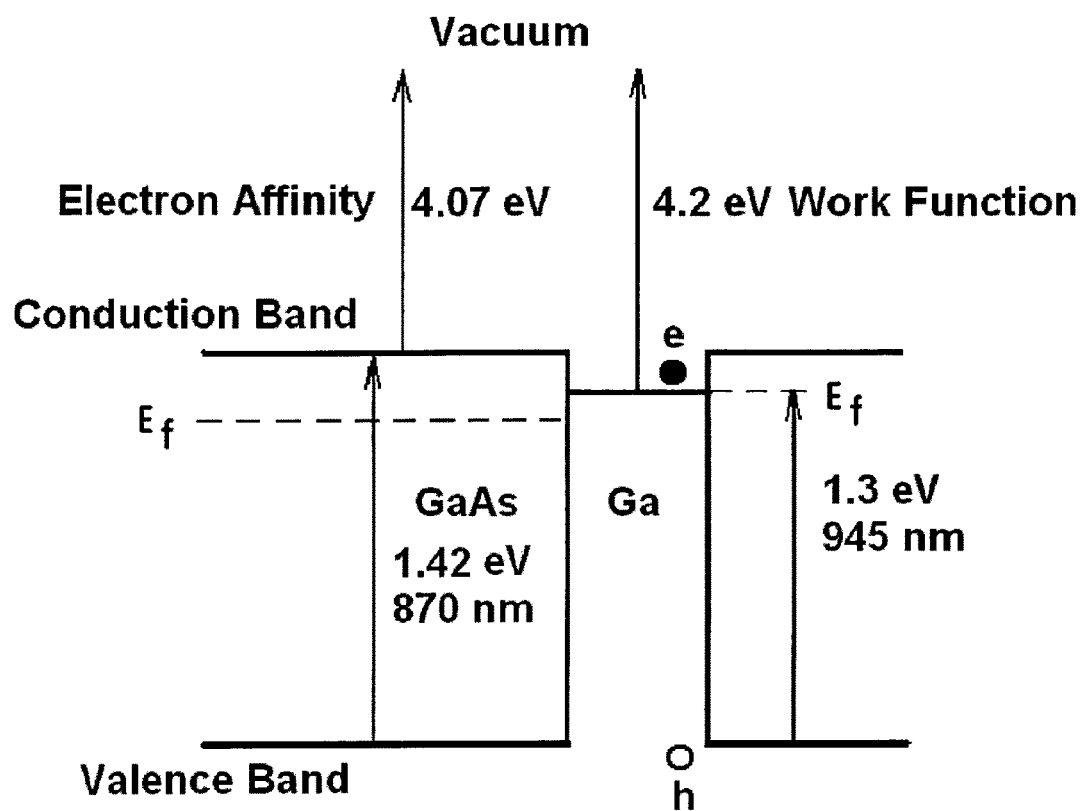
FIG. 12 shows flatband energy level structure for Ga nanowires in GaAs.
Figure 13:
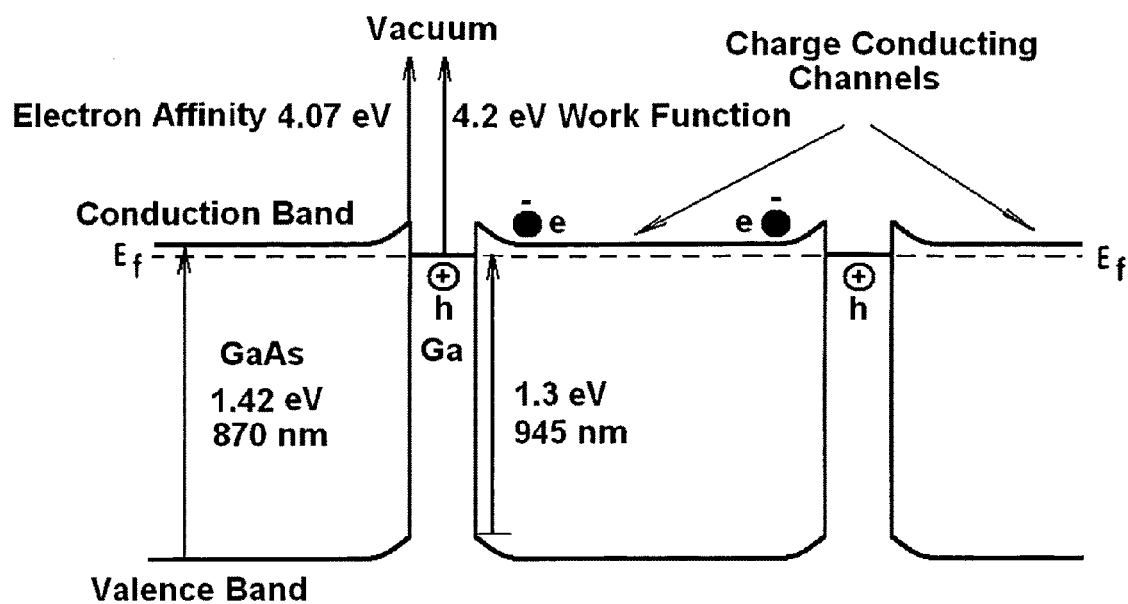
FIG. 13 shows Schottky barriers and energy diagram for Ga nanowires self-assembled in n-doped GaAs.
Figure 14:
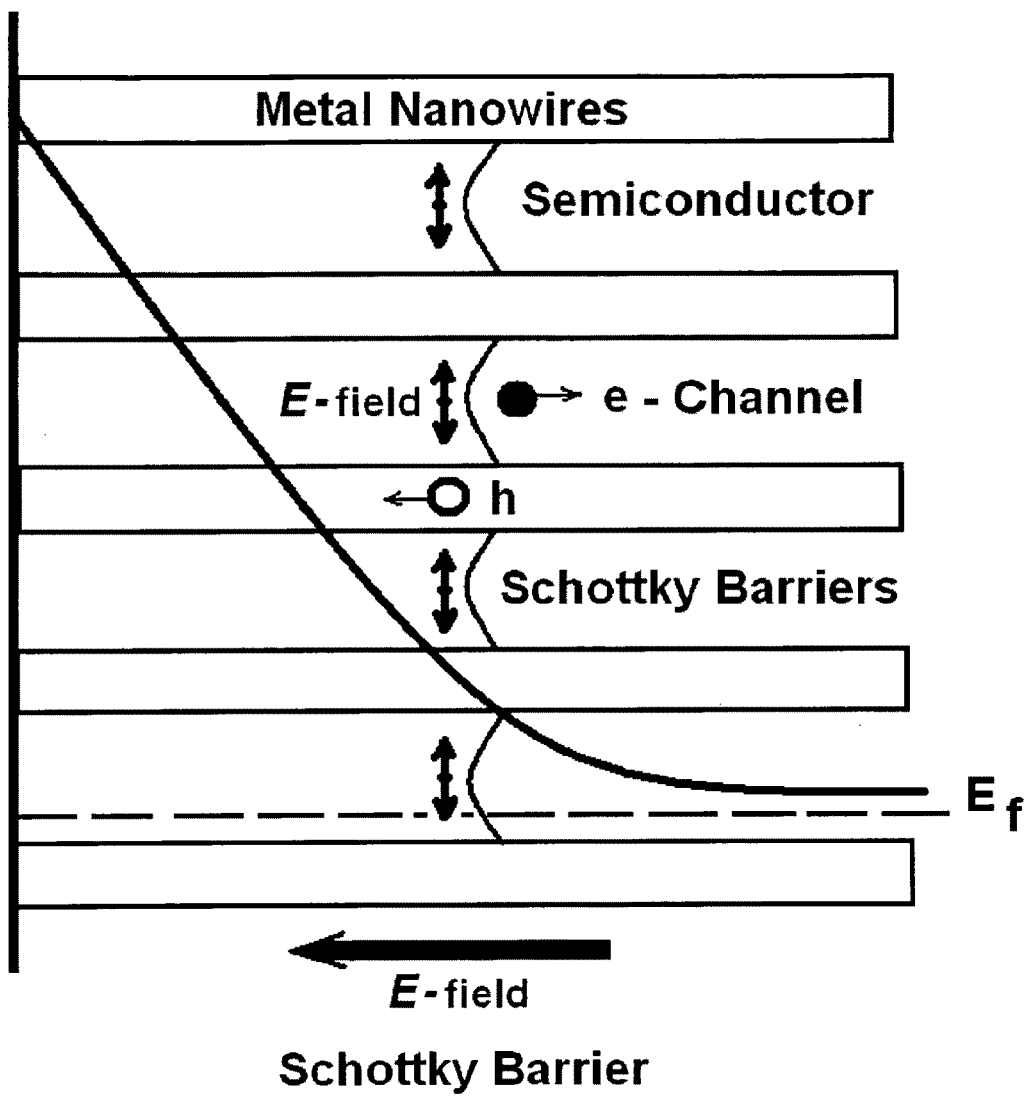
FIG. 14 illustrates geometry of metal nanowires self-assembled in the near-surface region of semiconductor and built-in electric fields in the depletion region of near-surface band bending and in Schottky barriers around the nanowires.

The metal nanowire arrays self-assembled in semiconductor materials can exhibit nonlinear optical and electro-optical properties resulting in change of the material refractive index either under illumination with the light or due to electrical injection of free charge carriers in the corresponding conduction and valence band. Mechanism of such nonlinearity can be explained as follows. Metal nanowires self-assembled in the depleted near-surface region of semiconductor form Schottky barriers at their interfaces with semiconductor material either for electrons or for holes depending on the relative magnitudes of work functions of the nanowire metal and semiconductor material. For example, Ga nanowires in GaAs material exhibit Schottky barriers for electrons. FIG. 12 shows flatband energy diagram for Ga nanowires in GaAs. FIG. 13 shows the Schottky barriers for Ga nanowires self-assembled in n-doped GaAs. FIG. 14 shows geometry of the metal nanowires self-assembled in the near-surface region of semiconductor and built-in electric field of the Schottky barriers.

The absorbed light photogenerates electron-hole pairs in depletion region of the semiconductor material, which are specially separated by built-in electric field of the near-surface band bending. Because the Schottky barriers around nanowires prevent the electrons from penetrating into metal nanowires, they move away from the surface of semiconductor in charge conducting channels around the nanowires. The holes are trapped by the nanowires and charge them. The same happens to the corresponding charge carriers injected into this region from an external electrical source.

Strong Coulomb repulsion between charges trapped in the nanowires changes shape of the nanowires. The nanowires having originally the shape close to cylinder assume more round shape resembling ellipsoid. The change in the nanowire shape results in the change of refractive index of the entire nanocomposite material under light illumination or electrical charge injection. In the preferred embodiment this property is used for design of various all-optical or electro-optical devices. The nonlinear change of refractive index can be used for all-optical and electro-optical light modulation, self-focusing, optical limiting, optical phase conjugation, bistable switching for optical memory and logic gates for optical computing. Examples of these devices also include, but not limited to, all components listed above, such as tunable nonlinear photonic crystals, waveguides, tunable Bragg filters, tunable diffraction gratings and diffractive optics, spatial light modulators based on tunable diffractive optics and tunable phase retardation plates based on subwavelength nonlinear materials with artificial birefringence. Discharge of the metal nanowires after trapping the charges takes some time resulting in a memory effect. In the preferred embodiment this memory effect is employed for optical recording of information or for design of optical delay elements.

In the preferred embodiment, the properties of Schottky barriers formed at the interfaces between metal nanowires and semiconductor materials are used for fabrication of photovoltaic materials and imaging detectors sensitive to the infrared light, for which the matrix semiconductor material is transparent.

Figure 15:
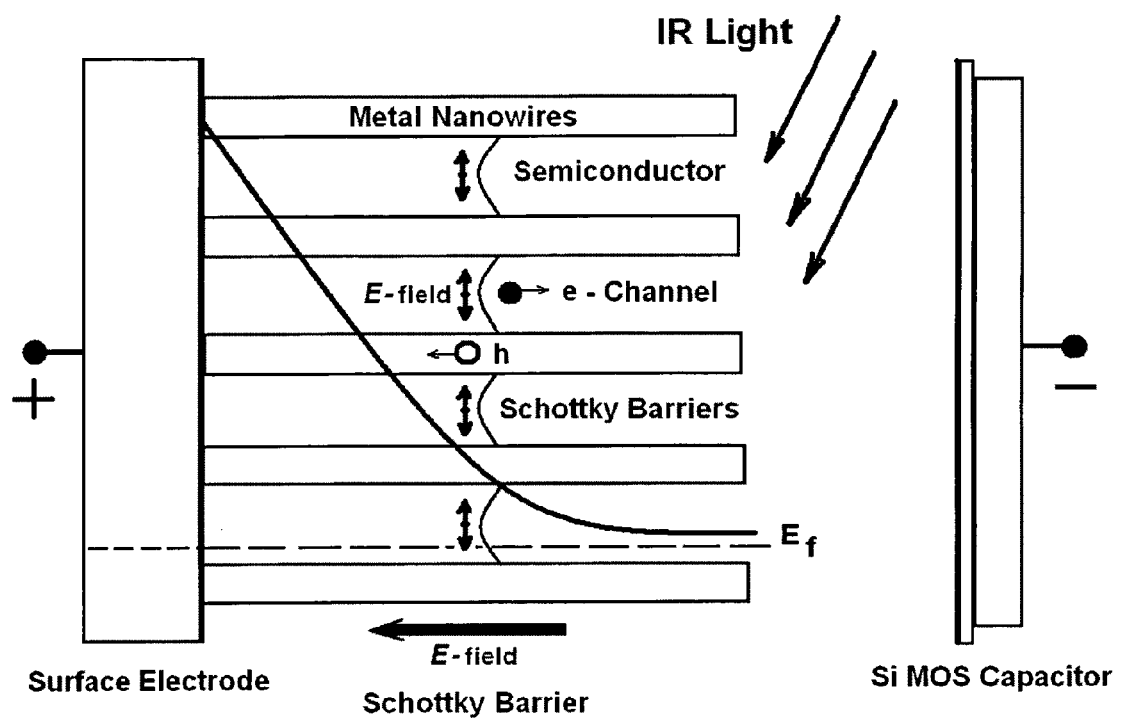
FIG. 15 shows schematic of a sensitive pixel of IR imaging detector employing the metal nanowire array.

FIG. 15 illustrates one possible design and operation principle of a sensitive pixel of the infrared imaging detector comprising the photosensitive metal nanowire array incorporated into n-type semiconductor and aligned perpendicular to its surface. The nanowire array forms electrical contact with a metal electrode deposited on surface of the semiconductor. The Schottky barrier between the metal electrode and semiconductor material creates built-in electric field in the near-surface region of the semiconductor. The electrons photogenerated in metal nanowires are injected into semiconductor material and moved along electron-conducting channels created by Schottky barriers around the metal nanowires. The positive holes are collected at the surface electrode. This builds photovoltage across the nanostructured semiconductor material. The electrons photogenerated in individual pixels charge MOS capacitors, which are employed in conventional silicon read-out electronics based on CCD or CMOS technology for imaging.

The metal nanowires having diameter much smaller than the energy relaxation length for charge carriers in the metal ensure efficient injection of the photogenerated charges into semiconductor material. Height of the barrier between metal nanowires and semiconductor determines cut-off wavelength of the detected infrared photons. The same Schottky barriers that form charge-conducting channels in the semiconductor material around nanowires provide efficient separation of the charges photogenerated in metal nanowires by the infrared photons having energy exceeding height of the Schottky barriers. Effective absorption of IR light by sufficiently dense and long array of nanowires and efficient injection into semiconductor of the photogenerated charges form the nanowires having large surface-to-volume ratio ensure high quantum efficiency of the photosensitive nanomaterial, high sensitivity of the infrared detector and its operation at room temperature. Only charges moving in a very small solid angle along the nanowire axis are lost.

Conventional silicon electronics based on CCD or CMOS technology can be used for image read-out by collecting in corresponding MOS capacitors of the charges photogenerated in individual pixels. Quantum efficiency of the detector can be estimated as ratio of the number of absorbed photons to the number of charges delivered to MOS capacitors of CCD.

The charge carriers remain well confined in the channels around nanowires during their transport to read-out CCD electronics. This ensures small crosstalk between neighboring pixels of the detector and high spatial resolution depending on the pixel size. The spatial resolution is expected to be the same as in conventional CCDs suggesting the possibility of fabrication of large-format infrared imaging detectors and focal plane arrays (FPA) having at least 1024×1024 pixels with pitch size smaller than 10 µm.

Due to high charge mobility in both the semiconductor channels and silicon material and due to relatively small length of the photosensitive nanowire array, response time of the detector is basically determined by speed of the read-out electronics. Compatibility with silicon CCD and CMOS read-out electronics and the possibility of employing standard image processing software ensure cost-efficiency of the infrared imaging detector systems.

One preferred embodiment of the infrared detector employs Ga nanowires self-assembled in GaAs semiconductor material. FIG. 13 shows energy diagram and the Schottky barriers for Ga nanowires in GaAs. In that case the electron-hole pairs can be photogenerated in Ga nanowires by MWIR and LWIR photons with energy exceeding 0.13 eV. Because diameter of the metal nanowires (of about 10 nm) is much smaller than the energy relaxation length for the charge carriers (typically $10^{-5}$ cm), almost all photogenerated electrons, except those moving in a small solid angle along the nanowire axis, are efficiently injected into the semiconductor material.

Gold or platinum having work functions of 5.1 and 5.3 eV is one possible choice for fabrication of surface electrode in such a detector. Theoretically they should ensure the built-in potential of the Schottky barrier at GaAs of 1.0 and 1.2 eV accordingly. Aluminum and silver having work function of 4.28 and 4.3 eV respectively should provide the barrier heights of about 0.2 eV. However, due to the influence of surface states the actually measured barrier heights for Au, Pt, Ag and Al electrodes on n-doped GaAs are known to be very close to each other and equal to 0.9, 0.84, 0.88 and 0.8 eV accordingly.

Depth of the near-surface Schottky barrier shown in FIG. 15 is given by the following equation $$d=(2\epsilon\epsilon_0 V/eN)^{1/2},$$

where V is built-in voltage of the Schottky barrier and N is the concentration of free carriers in semiconductor. At V=0.9 V and doping concentration in GaAs of $10^{16}$ cm$^{-3}$, the depth is about 1 μm.

Length of the nanowires in self-assembling arrays fabricated using the photo-modification in liquid is basically determined by the depth of near-surface band bending due to surface states in GaAs enhanced by acceptors dissolved in the liquid. At band bending of V=0.9 V and doping concentration of N=$10^{16}$ cm$^{-3}$ the depth $l_d$ of field penetration in semiconductor can be estimated to be about 1 μm. Absorption coefficient for infrared light in Ga is α=1.7 $10^5$ cm$^{-1}$. Therefore, fabrication of the Ga nanowires with the length of about 0.1-1 μm should ensure complete absorption of MWIR and LWIR photons in sufficiently dense arrays.

It is known that electron mobility in GaAs is 8500 cm$^2$ V$^{-1}$ s$^{-1}$. The depth of the Schottky barrier created by surface electrode (1 μm) is much smaller than the electron diffusion length in GaAs (10 μm). At strength of the built-in electric field of E=$10^4$ V/cm, corresponding to the barrier height of 0.9-1 eV and depth d=1 the drift velocity of charge carriers is found to be $v_{drift}$=μE=8.5 $10^7$ cm/s. Hence, the transit time of the electron moving along the charge conducting channel to MOS capacitor of read-out CCD is given by $\tau_{tr}$=d/$v_{drift}$=$10^{-7}$ sec. Therefore, the detector response time is basically determined by the speed of silicon read-out electronics. This suggests the possibility of fabrication of high-speed and high-efficiency MWIR and LWIR detectors based on nanowire arrays self-assembled in GaAs material.

Figure 16:
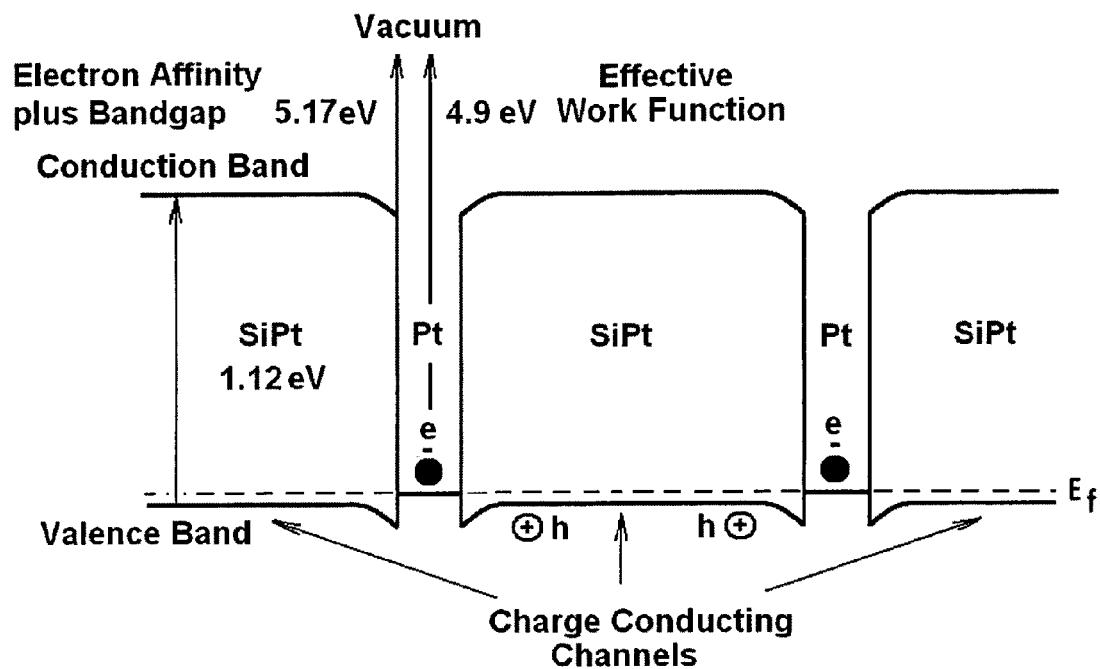
FIG. 16 illustrates Schottky barriers for Pt nanowires in p-doped SiPt.

FIG. 16 shows another preferred embodiment of the infrared detector based on SiPt employing the Schottky barriers for metal nanowire arrays self-assembled in p-doped silicon from artificially introduced interstitial Pt defects. In that case the photogenerated holes are injected from Pt nanowires into charge conducting channels formed by the Schottky barrier in SiPt. The similar detectors can also employ nanowires self-assembled from other defect atoms artificially to introduced in the semiconductor matrix material.

Another important application of the process of photo-modification is fabrication of efficient electrical contacts to the semiconductor materials or efficient heat sink on the semiconductor materials. In the case when work functions of the metal nanowires does not exceed the work function of semiconductor material the self-assembled nanowires form ohmic contact with the semiconductor. In the preferred embodiment the metal nanowires self-assembled in the near-surface region of the semiconductor material are made in an electrical contact with a metal electrode fabricated on the semiconductor surface using such methods as sputtering in the vacuum or electroless deposition of metal from an electrolyte solution.

The electroless deposition is well-developed technique for fabrication of thin metal films on dielectrics or semiconductors. Laser ablation is often used for creating defects on surface of the dielectric or semiconductor to ensure strong adhesion of the deposited metal in specific regions. The process of photo-modification creating defects on the semiconductor surface can also be used for electroless deposition of a metal film forming specific pattern on the surface. This method offers an efficient technique for fabrication of ohmic metal contacts to semiconductor materials. It can also be used for fabrication of electrodes for individual nanowires or nanowire arrays in various electronic circuits, transistors, and plasmonic nanodevices.

In another preferred embodiment the metal nanowire arrays being in contacts with the metal electrode deposited on surface of the semiconductor are employed as efficient heat sink for electronic and optoelectronic devices, such as microprocessors or laser diodes. Due to large surface-to-volume ratio of the nanowires they efficiently collect heat in the entire volume of near-surface region of the semiconductor material and then conduct it to the metal electrode deposited on semiconductor surface, from which the heat could be easily removed.

In still another preferred embodiment the nanocomposite semiconductor material comprising the array of metal nanowires being in contact with metal electrodes deposited on surface of the semiconductor is employed as a metamaterial exhibiting negative reflection. The materials with negative reflection can be used, for example, for fabrication of superlenses providing resolution better than diffraction limit.

In the preferred embodiment this technique is used for fabrication of a conducting metal grid with subwavelength period directly on pixels of infrared imaging detectors, such as HgCdTe, InSb or Si detectors. The grids having proper orientations make each pixel of the detector sensitive to specific Stokes parameter of the light polarization for performing polarimetric imaging. The grids with any required orientation can be fabricated using electroless deposition of the metal on the grating holographically recorded in semiconductor material of the detector pixels employing photo-modification. An interference pattern of two laser beams projected trough corresponding photo masks is used to record the gratings of specific orientation mating positions of the detector pixels.

The metal nanowires playing the role of waveguides for tightly localized light waves are key components of many future plasmonic devices. Surface plasmon polariton is a hybrid of electromagnetic field and electrical currents bound to the surface of a metal. The plasmonic waveguides, while lossy compared with optical fibers, need to carry information only at short distance across a chip. Thus, plasmonics is expected to be the bridge that links electronics with photonics. Because semiconductor materials are workhorse of the modern electronics and optoelectronics, the development of efficient methods for fabrication of metal nanowires incorporated into the semiconductor materials is of great importance for many applications. The technology of photo-modification, which allows fabrication of both individual metal nanowires and metal nanowire arrays in the semiconductor materials, offers a unique tool for manufacturing various linear and nonlinear plasmonic devices.

Because on silver and gold surfaces the plasmons can propagate for hundreds of wavelengths, the nanowires made of these materials are the most important for implementation of the future plasmonic devices. In the preferred embodiment silver or gold interstitial material is artificially introduces in a semiconductor matrix, such as silicon, using, for example, ion implantation or diffusion techniques. Then the silver or gold nanowires or nanowire arrays are self-assembled from the interstitial material employing the process of photo-modification described above.

Having described preferred embodiments of the invention with reference to the accompanying drawings, it is to be understood that the invention is not limited to the precise embodiments, and that various changes and modifications may be effected therein by skilled in the art without departing from the scope or spirit of the invention as defined in the appended claims.

What is claimed is:

1. A method of light-assisted fabrication of nanocomposite semiconductor materials and electronic, optoelectronic, photonic and plasmonic devices incorporating metal or semiconductor aligned nanowires self-assembled in matrix semiconductor material comprising the steps of
selecting a compound matrix semiconductor material, including GaAs, AlGaAs, InGaAsP, InP, GaP, GaN, ZnSe, ZnS, ZnO, HgCdTe, CdTe, InSb, GaSb, InAs, AgBr, AgF, AgCl, CdS, comprising charged self-interstitial defect atoms, from which the nanowires are to be self-assembled, or a matrix semiconductor material, including Si, Ge and various organic semiconductors, in which foreign charged interstitial defect atoms can be artificially introduced for self-assembling from them the nanowires,
creating sufficiently strong electric field by applying voltage across the semiconductor material to move the charged interstitial defect atoms inside the matrix semiconductor material in the direction of nanowire alignment and to deplete from free charge carriers the region of the matrix semiconductor material where nanowires are to be self-assembled,
illuminating the semiconductor material with light to photogenerate free charge carriers in the conduction and valence band of the semiconductor material in the regions where nanowires are to be self-assembled using the light at wavelength having sufficiently strong absorption, including the light at wavelength of fundamental absorption in the matrix semiconductor material and the light at wavelength slightly above edge of the spectral region of fundamental absorption, which can deeply penetrate inside the semiconductor material,
selecting the light intensity that ensures photogeneration of enough free charge carriers for transformation of the charged interstitial defect atoms into neutral nanowire material, but does not generate too many free charge carriers preventing penetration of said electric field into the matrix semiconductor material due to field screening effect,
creating an additional fast oscillating electric field in the matrix semiconductor material having frequency exceeding the inverse lifetime of the photogenerated free charge carriers and having amplitude ensuring capture of the photogenerated free charge carriers from corresponding conduction or valence band by the charged interstitial defect atoms resulting in formation of neutral nanowire material using such means as modulating the applied voltage or irradiating the semiconductor material with electromagnetic radiation,
continuing the process at room temperature or at elevated temperature until the aligned nanowires of required size are self-assembled.

2. A method of light-assisted fabrication of nanocomposite semiconductor materials and electronic, optoelectronic, photonic and plasmonic devices of claim 1, wherein said sufficiently strong electric field moving the charged interstitial defect atoms inside the matrix semiconductor material in the direction of nanowire alignment and depleting from free charge carriers the region of the matrix semiconductor material where nanowires are to be self-assembled is created by the Schottky barrier between the semiconductor and a metal deposited on surface of the semiconductor material.

3. A method of light-assisted fabrication of nanocomposite semiconductor materials and electronic, optoelectronic, photonic and plasmonic devices of claim 1, wherein
surface of the semiconductor material is brought into contact with a highly polar liquid having optional dopants dissolved in it,
said built-in electric field is created in the near-surface region of said semiconductor material employing inherent near-surface band bending due to surface states being enhanced by said optional dopants performing the functions of corresponding surface acceptors or donors,
said fast oscillating electric field is created in the near-surface region of the semiconductor material by molecules of said highly polar liquid, and
said illuminating the semiconductor material with light in the regions where the aligned nanowires are to be self-assembled is performed using laser interference holography and photomasks defining geometry of structures comprising the self-assembled nanowires.

4. A method of light-assisted fabrication of nanocomposite semiconductor materials and electronic, optoelectronic, photonic and plasmonic devices of claim 1, wherein
surface of the semiconductor material is brought into contact with a highly polar liquid,
said built-in electric field is created in the near-surface region of said semiconductor material employing p-n junction between properly doped regions of the semiconductor material,
said fast oscillating electric field is created in the near-surface region of the semiconductor material by molecules of said highly polar liquid, and
said illuminating the semiconductor material with light in the regions where the aligned nanowires are to be self-assembled is performed using laser interference holography and photomasks defining geometry of structures comprising the self-assembled nanowires.

5. A method of light-assisted fabrication of nanocomposite semiconductor materials and electronic, optoelectronic, photonic and plasmonic devices of claim 3, wherein said illuminating the semiconductor material is performed with near-field light at the fundamental absorption wavelength employing probes of the near-field scanning optical microscope, sharp metal tips, and nano-templates made of a metal film having nanochannels transmitting the near-field light due to plasmon effects, including a periodic system of nanochannels, defining specific position of seed points for self-assembling individual nanowires and nanowire arrays.

6. A method of light-assisted fabrication of nanocomposite semiconductor materials and electronic, optoelectronic, photonic and plasmonic devices of claim 3, wherein said array of self-assembling aligned nanowires is made of metal material, including the metal material having work function not exceeding work function of the semiconductor material, and is incorporated in said matrix semiconductor material in the region near its surface such that said nanowires form electric contact and thermal contact with at least one metal electrode, which is fabricated on said surface of semiconductor using sputtering of the metal in vacuum or electroless deposition of the metal from electrolyte solution, forming efficient electrical contacts to said semiconductor material, including ohmic contacts, for application in various electronic circuits, transistors, plasmonic nanodevices and also forming thermal contacts to said semiconductor material for efficient heat removal from various electronic and optoelectronic devices, including microprocessors or laser diodes.

7. A method of light-assisted fabrication of nanocomposite semiconductor photovoltaic materials and electronic, optoelectronic, photonic and plasmonic devices, including infrared detectors, of claim 3, wherein said self-assembled array comprising disordered or periodic system of nanowires is made of metal material having such work function that ensures height of the Schottky barriers at the boundary between the nanowires and semiconductor material, which is required for injection in the semiconductor material of free charge carriers photogenerated in the metal nanowires by detected infrared photons having wavelength shorter than given cut-off wavelength, and also ensures formation of channels conducting the charge carriers in the semiconductor material around the nanowires, and an electrode is fabricated on surface of the semiconductor form metal having such work function that creates another Schottky barrier between the surface electrode and semiconductor material with sufficiently strong built-in electric field to move the photogenerated charge carriers along said channels away form the surface electrode producing photovoltage across the semiconductor material.

8. A method of light-assisted fabrication of imaging infrared detectors of claim 7, wherein said infrared detectors are fabricated form silicon matrix semiconductor material, in which said metal nanowires are self-assembled from charged interstitial defect atoms, including Pt, artificially introduced in the matrix semiconductor material, as well as from compound semiconductor materials, including GaAs, grown on silicon substrate, in which said metal nanowires are self-assembled from charged self-interstitial defect atoms, and silicon based CCD and CMOS read-out electronics is employed for collecting the photo-generated charge carriers and infrared imaging.

9. A method of light-assisted fabrication of nanocomposite materials and electronic, optoelectronic, photonic and plasmonic devices of claim 3, wherein nonlinear optical and electro-optical response of the nanocomposite semiconductor material incorporating said array of self-assembling aligned nanowires is used for performing such functions as all-optical and electro-optical light modulation, self-focusing, optical limiting, optical phase conjugation, bistable switching for optical memory and logic gating for optical computing.

10. A method of light-assisted fabrication of nanocomposite semiconductor materials and electronic, optoelectronic, photonic and plasmonic devices of claim 3, wherein nonlinear optical and electro-optical memory effect in said self-assembling arrays of aligned nanowires incorporated in said matrix semiconductor material is used for performing such functions as optical recording of information and optical delay.

11. A method of light-assisted fabrication of nanocomposite semiconductor materials and electronic, optoelectronic, photonic and plasmonic devices of claim 3, wherein said self-assembling nanowires decreasing refractive index of the nanocomposite semiconductor material are used for fabrication of antireflection layers on various semiconductor materials, including ZnSe, ZnS, GaAs, InP, HgCdTe, CdTe, Si, Ge, AgBr, AgCl, and said process is continued until the refractive index of said nanocomposite semiconductor material decreases down to the value equal to square root of the refractive index of pristine material and effective depth of the nanocomposite layer is equal to the quarter of light wavelength in the nanocomposite material.

12. A method of light-assisted fabrication of nanocomposite semiconductor materials and electronic, optoelectronic, photonic and plasmonic devices of claim 3, wherein the decrease of refractive index and nonlinear properties of said matrix semiconductor materials, including GaAs, AlGaAs, InGaAsP and InP, incorporating said array of self-assembling aligned nanowires are employed for optical recording the integrated-optical channel waveguide structures and components using the methods of projection photolithography, and laser interference is used for recording in said channel waveguides of the photonic crystal structures, holographic Bragg gratings and Bragg filters for linear and nonlinear all-optical and electro-optical signal processing, wavelength division multiplexing and sensor applications.

13. A method of light-assisted fabrication of nanocomposite semiconductor materials and electronic, optoelectronic, photonic and plasmonic devices of claim 12, wherein two-photon absorption of the recording light is used for recording physical holograms in said integrated-optical channel waveguide structures and components at the wavelength of their operation, including telecommunication wavelengths of 1.3 and 1.55 micron.

14. A method of light-assisted fabrication of nanocomposite semiconductor materials and electronic, optoelectronic, photonic and plasmonic devices of claim 12, wherein p-n junction in the laser diode creates said built-in electric field and said channel waveguide and photonic crystal structures made of said matrix semiconductor material incorporating said self-assembling arrays of aligned nanowires are recorded along the laser cavity in close proximity to active region of said laser diode p-n junction for fabrication of waveguide laser diodes and photonic crystal laser diodes exhibiting increased spectral brightness, improved beam quality, thermal stability and overall efficiency.

15. A method of light-assisted fabrication of nanocomposite semiconductor materials and electronic, optoelectronic, photonic and plasmonic devices of claim 3, wherein said array of self-assembling aligned nanowires is incorporated in said matrix semiconductor materials, including ZnSe, ZnS, GaAs, Si, Ge, AgBr, AgCl, geometry of refractive index structure created in near surface region of the nanocomposite semiconductor material is defined by said photomask and laser beam interference, and said process is continued until the refractive index change in the nanocomposite layer of semiconductor material is sufficient for fabrication of relief-free thin plate diffractive optics, including volume phase holographic gratings, wavefront transformation elements, Fresnel lenses, beam focusing and beam shaping optics, including nonlinear all-optical and electro-optical spatial light modulators, tunable diffraction gratings and light filters.

16. A method of light-assisted fabrication of nanocomposite semiconductor materials and electronic, optoelectronic, photonic and plasmonic devices of claim 15, wherein said nanostructured semiconductor material incorporating the self-assembled array of aligned metal nanowires performs functions of a grid light polarizer transmitting the light component polarized perpendicular to nanowires and reflecting the light component polarized parallel to nanowires, and the recorded relief-free volume phase holographic grating having subwavelength period smaller than light wavelength and operating as nonlinear semiconductor material with artificial birefringence performs functions of tunable phase retardation plates, half-wavelength and quarter-wavelength waveplates controlling the light polarization.

17. A method of light-assisted fabrication of nanocomposite semiconductor materials and electronic, optoelectronic, photonic and plasmonic devices of claim 16, wherein said holographic gratings with subwavelength period are recorded directly on pixels of infrared imaging detectors, including HgCdTe, InSb and Si detectors, and then coated with a metal film employing electroless deposition to produce subwavelength conducting grids on said pixels with certain orientation making each pixel of the detector sensitive to specific Stokes parameter of light polarization for performing polarimetric imaging.

18. A method of light-assisted fabrication of nanocomposite semiconductor materials and electronic, optoelectronic, photonic and plasmonic devices of claim 3, wherein said nanocomposite semiconductor material incorporating the array of self-assembling metal nanowires, being in contact with metal electrodes deposited on surface of the semiconductor, performs functions of a metamaterial exhibiting negative reflection, which is used in advanced photonic devices, including superlenses providing resolution better than diffraction limit.

19. A method of light-assisted fabrication of nanocomposite semiconductor materials and electronic, optoelectronic, photonic and plasmonic devices of claim 3, wherein large decrease of the refractive index in said matrix semiconductor material incorporating the arrays of self-assembling nanowires is used for optical recording of diffraction gratings on side surface, on end face and in core of middle-infrared optical fibers made of semiconductor materials, including AgCl and AgBr.

20. A method of light-assisted fabrication of nanocomposite semiconductor materials and electronic, optoelectronic, photonic and plasmonic devices of claim 3, wherein said moving the charged self-interstitial defect atoms is used for cleaning from the interstitial defects of specific regions of said semiconductor material illuminated with the light, including cleaning form the defects of photovoltaic materials, solar cells and active region of p-n junction in semiconductor laser diodes and light emitting diodes to improve performance of the optoelectronic devices.

* * * * *